[12] United States Patent
Wang et al.

(10) Patent No.: US 11,745,401 B2
(45) Date of Patent: Sep. 5, 2023

(54) MOLDED CIRCUIT BOARD OF CAMERA MODULE, MANUFACTURING EQUIPMENT AND MANUFACTURING METHOD FOR MOLDED CIRCUIT BOARD

(71) Applicant: NINGBO SUNNY OPOTECH CO., LTD., Zhejiang (CN)

(72) Inventors: Mingzhu Wang, Ningbo (CN); Bojie Zhao, Ningbo (CN); Takehiko Tanaka, Ningbo (CN); Zhen Huang, Ningbo (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 1279 days.

(21) Appl. No.: 16/307,151

(22) PCT Filed: Jun. 6, 2017

(86) PCT No.: PCT/CN2017/087315
§ 371 (c)(1),
(2) Date: Dec. 5, 2018

(87) PCT Pub. No.: WO2017/211266
PCT Pub. Date: Dec. 14, 2017

(65) Prior Publication Data
US 2019/0134866 A1 May 9, 2019

(30) Foreign Application Priority Data
Jun. 6, 2016 (CN) .......................... 201610399525.6

(51) Int. Cl.
*B29C 45/14* (2006.01)
*H05K 3/00* (2006.01)
(Continued)

(52) U.S. Cl.
CPC .. *B29C 45/14336* (2013.01); *B29C 45/14065* (2013.01); *H04N 23/00* (2023.01);
(Continued)

(58) Field of Classification Search
CPC .... B29C 2045/14663; B29C 2791/006; B29C 2793/009; B29C 45/02; B29C 45/14065;
(Continued)

(56) References Cited

U.S. PATENT DOCUMENTS 9,267,894 B2    2/2016  Ito et al.
11,161,291 B2 * 11/2021 Wang ...................... B29C 45/64
(Continued)

FOREIGN PATENT DOCUMENTS

CN          1089992        8/2002
CN          102548729      7/2012
(Continued)

*Primary Examiner* — Minh N Trinh
(74) *Attorney, Agent, or Firm* — Wenderoth, Lind & Ponack, L.L.P.

(57) ABSTRACT

A manufacturing equipment, for manufacturing a molded circuit board assembly of a camera module, includes an upper mould, a lower mould, a mould fixing arrangement, and a temperature controlling arrangement, wherein the mould fixing arrangement controls opening and closing of the upper mould and the lower mound. When a substrate board is placed between the upper mould and the lower mound, a molding cavity is further formed between the upper mould and the lower mound, wherein in the molding cavity, a supporting frame forming groove is formed for forming the module support, and a light window forming element is used for forming a light window. The temperature controlling arrangement provides a molding temperature, the module supporting frame is integrally molded on the substrate board to form the molded circuit board assembly.

9 Claims, 22 Drawing Sheets

(51) Int. Cl.
    *H04N 23/00*    (2023.01)
    *H04N 23/54*    (2023.01)
    *H04N 23/55*    (2023.01)
    *B29L 31/34*    (2006.01)

(52) U.S. Cl.
    CPC ........ *H05K 3/00* (2013.01); *B29L 2031/3425* (2013.01); *H04N 23/54* (2023.01); *H04N 23/55* (2023.01)

(58) Field of Classification Search
    CPC ........ B29C 45/14336; B29C 45/14418; B29C 45/14655; B29C 45/1468; B29C 45/34; B29K 2063/00; B29L 2031/3425; H04N 5/225; H04N 5/2253; H04N 5/2254; H05K 2203/1316; H05K 3/00; H05K 3/284
    See application file for complete search history.

(56)            References Cited

U.S. PATENT DOCUMENTS

| | | | |
|---|---|---|---|
| 2002/0025352 | A1 | 2/2002 | Miyajima |
| 2012/0188148 | A1 | 7/2012 | DeJong |
| 2015/0138778 | A1 | 5/2015 | Oyama |
| 2016/0368176 | A1 | 12/2016 | Kasai |
| 2017/0244872 | A1 | 8/2017 | Wang et al. |
| 2019/0134866 | A1* | 5/2019 | Wang ................ B29C 45/14336 |

FOREIGN PATENT DOCUMENTS

| | | |
|---|---|---|
| CN | 102782574 | 11/2012 |
| CN | 103229100 | 7/2013 |
| CN | 103501932 | 1/2014 |
| CN | 105150459 | 12/2015 |
| CN | 105611134 | 5/2016 |
| EP | 0 847 233 | 6/1998 |
| EP | 2 647 486 | 6/2016 |
| EP | 3419275 A1 | 12/2018 |
| EP | 3419276 A1 | 12/2018 |
| JP | 5868940 | 4/1983 |
| JP | 2000-311909 | 11/2000 |
| JP | 2001-292365 | 10/2001 |
| JP | 200259453 | 2/2002 |
| JP | 2003-197655 | 7/2003 |
| JP | 2007523568 A | 8/2007 |
| JP | 2008-265020 | 11/2008 |
| JP | 2010-28698 | 2/2010 |
| JP | 2013516656 A | 5/2013 |
| JP | WO2013153721 A | 10/2013 |
| JP | 2013-254251 | 12/2013 |
| JP | WO2015133631 | 9/2015 |
| KP | 101397677 | 5/2014 |
| KP | 101587694 | 1/2016 |
| TW | 201410781 | 3/2014 |
| TW | 201545848 | 12/2015 |
| WO | WO2005072041 | 8/2005 |
| WO | 2011/008098 | 1/2011 |
| WO | WO2011008098 | 1/2011 |
| WO | 2011/084900 | 7/2011 |
| WO | WO2011084900 | 7/2011 |

* cited by examiner

MOLDED CIRCUIT BOARD OF CAMERA MODULE, MANUFACTURING EQUIPMENT AND MANUFACTURING METHOD FOR MOLDED CIRCUIT BOARD

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a manufacturing equipment, and more particularly to manufacturing equipment for molded circuit board assembly of camera module.

Description of Related Arts

A circuit board of a conventional mobile phone camera module is generally provided with electronic components such as capacitors, and plastic elements. The capacitors and the plastic elements are respectively independent and are not overlapped with each other. The plastic element plays a supportive role. The main disadvantages are as follows. The plastic supporting frame, after being formed, is affixed to the circuit board via adhesive. Since the plastic supporting frame has a poor flatness and is inclinedly assembled on the circuit board, the assembled camera module will suffers a tilt problem. Moreover, as the electronic components and a photosensitive device are received in the same space, the dust on the electronic components is not easy to clean up, which causes the camera module has dirty spots. The structure of the circuit board is not strong enough. The size of the camera module cannot be minimized, especially the transverse size, while spaces among multiple camera modules are comparatively wasted such that the overall size of the camera module is affected.

COB (Chip on Board) packaging process is one of the most important manufacturing processes for the conventional camera module. The conventional camera module manufactured in the COB process typically comprises a circuit board, a photosensitive device, a lens, a holder, a motor and other necessary components.

Furthermore, the holder is usually bonded to the circuit board via adhesive in the COB process. Because of the characteristics of the bonding process and the adhesive, the holder is prone to tilt and has an optical eccentric phenomenon. Thus, the holder has to be aligned by an active alignment process.

On the other hand, since the conventional holder is typically produced by a separate injection molding process, the holder has a poor flatness and the number of the holder that can be manufactured at a time is relative small. During the assemble process, the holder is bonded to the circuit board and the camera modules are assembled one by one, thus the manufacturing process for the camera module is relatively complex and the production efficiency is relatively low.

It is worth mentioning that some circuit components, such as resistors, capacitors, etc., are mounted on the circuit board as circuit drive elements. These circuit components are protruded from the circuit board. The assembly relationship between the circuit board, the circuit components and the holder has some unfavorable factors, which restricts the lighting and thinning development of the camera module.

During the COB process, the holder is bonded on the circuit board by adhesive such as glue. The holder is typically aligned by the active alignment process, that is, the central axes of the holder, the circuit board and the motor are required to calibrate until they are conform in both the horizontal and vertical direction. Thus, in order to meet the requirement of the active alignment process, relatively excessive adhesive is preset between the holder and the circuit board and between the holder and the motor, so as to leave adjustable space with each other. As a result, on one hand, the thickness of the camera module is increased and the thickness of the camera module is not easy to decrease. On other hand, repeated bonding and assembling process are easy to result in the inconsistent tilt and the requirements for flatness of the holder, the circuit board and the motor are relatively higher.

Furthermore, the circuit board provides a basic base and supporting carrier in the conventional COB process. Thus, the circuit board is required to have a certain degree of structural strength, which makes the circuit board having a large thickness and causes the thickness of the camera module increased.

SUMMARY OF THE PRESENT INVENTION

The invention is advantageous in that it provides a manufacturing equipment for molded circuit board assembly of camera module and manufacturing method thereof, wherein the manufacturing equipment is capable of integrally producing a module supporting frame of a molded circuit board assembly of a camera module.

Another advantage of the invention is to provide a manufacturing equipment for molded circuit board assembly of camera module and manufacturing method thereof, wherein the production efficiency of the camera module can be improved with the manufacturing equipment.

Another advantage of the invention is to provide a manufacturing equipment for molded circuit board assembly of camera module and manufacturing method thereof, wherein a module supporting frame of the molded circuit board assembly is integrally formed and is attached to a substrate board of the molded circuit board assembly, the module supporting frame has a reliable and strong connection with the substrate board and enhances the structural strength of the substrate board meanwhile.

Another advantage of the invention is to provide a manufacturing equipment for molded circuit board assembly of camera module and manufacturing method thereof, wherein the camera module is manufactured by a molding process instead of the conventional COB process.

Another advantage of the invention is to provide a manufacturing equipment for molded circuit board assembly of camera module and manufacturing method thereof, wherein the molded circuit board assembly is produced by the molded process, so that the molded circuit board assembly is molded and integrally formed.

Another advantage of the invention is to provide a manufacturing equipment for molded circuit board assembly of camera module and manufacturing method thereof, wherein when the camera module is manufactured, a plurality of the substrate boards can be simultaneously and integrally formed as a substrate board array combination, thereby enabling a joint board array operation for manufacturing an integral piece of molded circuit board assembly array of the camera module, and improving its productivity.

Another advantage of the invention is to provide a manufacturing equipment for molded circuit board assembly of camera module and manufacturing method thereof, wherein the molded circuit board assembly of the camera module is manufactured by the manufacturing equipment, which is able to improve the production efficiency of the molded circuit board assembly, thereby improving the production efficiency of the camera module.

Another advantage of the invention is to provide a manufacturing equipment for molded circuit board assembly of camera module and manufacturing method thereof, wherein the molded circuit board assembly of the camera module is manufactured by a manufacturing equipment, the manufacturing equipment is able to increase the yield of the molded circuit board assembly, thereby increasing the yield of the camera module.

Additional advantages and features of the invention will become apparent from the description which follows, and may be realized by means of the instrumentalities and combinations particular point out in the appended claims.

According to the present invention, the foregoing and other objects and advantages are attained by a manufacturing equipment, for manufacturing a molded circuit board assembly of a camera module, comprising:

at least one upper mould, at least one lower mould, at least one mould fixing arrangement and at least one temperature controlling arrangement, wherein the mould fixing arrangement is configured to control an opening and closing of the upper mould and the lower mound, wherein when at least one substrate board is placed in the upper mould or the lower mound and the upper mould and the lower mound are in a closed-mould state, a molding cavity is formed between the upper mould and the lower mound, wherein at least one module supporting frame is formed inside the molding cavity, wherein the molding cavity has at least one supporting frame forming groove for forming the module supporting frame and the upper mould or the lower mound further comprises at least one light window forming element, wherein the temperature controlling arrangement controls a molding temperature for the molded circuit board assembly. The module supporting frame is integrally molded on the substrate board to form the molded circuit board assembly, wherein the light window forming element is used for forming at least one light window of the module supporting frame.

In one embodiment, the upper mould has at least one upper molding surface and the lower mould has at least one lower molding surface, and the substrate board of the molded circuit board assembly is disposed on the lower molding surface, wherein when the upper mould and the lower mound are in the closed-mould state, the molding cavity is formed between the upper molding surface and the lower molding surface.

In one embodiment, the upper mould has the at least one supporting frame forming groove and at least one the light window forming element, wherein the supporting frame forming grooves and the light window forming elements define a configuration of the upper molding surface, wherein the lower mould has at least one substrate board receiving groove defining a configuration of the lower molding surface for placing the substrate board thereat.

In one embodiment, the upper mould further has at least one main flow channel groove, wherein the lower mould further has at least one material discharging chute, and the main flow channel groove and the material discharging chute form at least one main flow channel, wherein when the upper mould and the lower mound are in the closed-mould state, at least one sub flow channel is formed between the upper mould and the lower mound, each of the sub flow channels is communicated with respective molding cavity, wherein at least one molding material entering the main flow channel is guided to the molding cavity through the sub flow channel to form the module supporting frame within the molding cavity, and at least one solidified molded body within the main flow channel and the sub flow channel.

In one embodiment, the upper mould and/or the lower mould further has a forming cavity separating stair to separate the molding cavities, such that each of the module supporting frames is formed in each of the molding cavity respectively.

In one embodiment, the upper mould has at least one upper molding surface and the lower mould has at least one lower molding surface, wherein the substrate board of the molded circuit board assembly is placed on the upper molding surface. When the upper mould and the lower mound are in the closed-mould state, the molding cavity is formed between the upper molding surface and the lower molding surface.

In one embodiment, the lower mould further has at least one main flow channel groove and the upper mould further has at least one material discharging chute. The main flow channel groove and the material discharging chute form at least one main flow channel, wherein when the upper mould and the lower mound are in the closed-mould state, at least one sub flow channel is formed between the upper mould and the lower mound, each of the sub flow channels is communicated with respective molding cavity, wherein at least one molding material entering the main flow channel is guided to the molding cavity through the sub flow channel, and the module supporting frame is formed within the molding cavity, wherein at least one solidified molded extension is formed within the main flow channel and the sub flow channel.

In one embodiment, the manufacturing equipment further comprises at least one molding unit, wherein the upper mould, the lower mould and the mould fixing arrangement are fixed at the molding unit, and the molding unit is configured for integrally forming the module support.

In one embodiment, the molding unit further comprises at least one loading platform, wherein the mould fixing arrangement is a pressing device, the pressing device is configured to control the opening and closing of the upper mould and the lower mound, wherein the upper mould is fixed to the pressing member and the lower mould is supported on the loading platform.

In one embodiment, the manufacturing equipment further comprises at least one material unit, at least one feeding unit and at least one transporting unit. The material unit is configured to supply the molding material which forms the module support. The feeding unit is used for providing at least one substrate board array having at least one substrate board. The transporting unit is configure to transport the substrate board array to the molding unit, wherein the material unit comprises at least one material transporting member quantificationally transports the molding material to the molding unit.

In one embodiment, the material unit further comprises at least one material supplying member and at least one material controlling member, wherein the material supplying member is configured to store and supply the molding material, and the material controlling member is configured to control an output quantity of the molding material.

In one embodiment, the material unit further comprises at least one material discharging element, the material discharging element comprises at least one plunger piston pushing the molding material into the molding cavity.

In one embodiment, the manufacturing equipment further comprises at least one cutting unit, wherein the cutting unit is configured to separate the solidified molded bodies, the module supporting frames, and molded circuit board combination into independent molded circuit board assembly.

In one embodiment, the manufacturing equipment further comprises at least one cleaning arrangement, wherein after the molded circuit board assembly with the module supporting frame is taken out between the upper mould and the lower mould, the cleaning arrangement is arranged to clean up the upper mould and the lower mould.

In one embodiment, the camera module comprises at least one lens, at least one photosensitive element and the molded circuit board assembly, wherein the lens is positioned in a light path of the photosensitive element.

In one embodiment, the module supporting frame forms at least one light window corresponding to the photosensitive element to define an optical path for the photosensitive element.

In one embodiment, the module supporting frame of the molded circuit board assembly is further integrally molded on a non-photosensitive area of the photosensitive element.

In one embodiment, the photosensitive element and a board of the substrate board are electrically connected by a set of leading wires, wherein the leading wires are coated in the module support module supporting frame of the molded circuit board assembly.

In one embodiment, the camera module comprises at least one optical filter overlapped with the photosensitive element, wherein the module supporting frame of the molded circuit board assembly is further integrally molded on the optical filter.

In one embodiment, a top portion of the module supporting frame of the molded circuit board assembly is extended upwardly to form at least one receiving groove for receiving the lens.

In one embodiment, the circuit board is provided with one or more through-holes and the module supporting frame of the molded circuit board assembly is extended into the through-holes.

In one embodiment, the camera module is a fixed focus type camera module or an auto focus type camera module.

According to the present invention, the foregoing and other objects and advantages are also attained by a manufacturing method for manufacturing a module supporting frame of a camera module, which comprises the following steps.

(a) Provide at least one molding material for forming the module supporting frame and transport at least one substrate board array with at least one substrate board to a position between at least one upper mould and at least one lower mould of a manufacturing equipment.
(b) Close the upper mould with the lower mound to form a molding cavity therebetween.
(c) Fill the molding material into the molding cavity.
(d) Solidify the molding material within the molding cavity to form the module supporting frame which is molded on the substrate board.

In one embodiment, the manufacturing method further comprises a step of quantificationally feeding the molding material into the molding cavity.

In one embodiment, prior to the step (a), the manufacturing method further comprises a step of pre-heating the substrate board array.

In one embodiment, the manufacturing method further comprises a step of moving the lower mould to an underside of the upper mould so as to close the lower mould with the upper mould.

In one embodiment, the manufacturing method further comprises a step of moving the upper mould to an upper side of the lower mould so as to close the upper mould with the lower mould.

In one embodiment, the step (c) further comprises a step of pushing the molding material into the molding cavity.

In one embodiment, the step (c) further comprises a step of pressurizedly pushing the molding material into the molding cavity.

In one embodiment, between the step (b) and the step (c), the manufacturing method further comprises a step of decreasing the air pressure within the molding cavity.

In one embodiment, the step (c) further comprises a step of heating the molding material within the molding cavity by at least one heating arrangement.

In one embodiment, the step (d) further comprises a step of heating the molding material within the molding cavity by at least one temperature controlling arrangement, so that the molding material within the molding cavity is solidified to form the module support.

In one embodiment, after the step (d), further comprises a step of separating the module supporting frame from a solidified molded extension, wherein the solidified extension is formed by the molding material but fails to form the module supporting frame in the molding cavity.

In one embodiment, the manufacturing method further comprises a step of forming one or more module supporting frame arrays each comprising a plurality of integrally combined module supporting frames on the substrate board array.

In one embodiment, the manufacturing method further comprises a step of cutting the substrate board array and the module supporting frame array to form a plurality of corresponding molded circuit board assemblies each comprising the module supporting frame and the substrate board.

In one embodiment, the manufacturing method further comprises a step of coating circuit electronic components protruded from the substrate board by the module supporting frame.

In one embodiment, the manufacturing method further comprises a step of mounting a photosensitive element on each substrate board of the substrate board array and the photosensitive element is positioned at an inner side of the substrate board.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. just indicate relations of direction or position are based on the relations of direction or position shown in the appended drawings, which is only to facilitate descriptions of the present invention and to simplify the descriptions, rather than to indicate or imply that the referred device or element must apply specific direction or to be operated or configured in specific direction. Therefore, the above mentioned terminologies shall not be interpreted as confine to the present invention.

It is understandable that the term "a" should be understood as "at least one" or "one or more". In other words, in one embodiment, the number of an element can be one and in other embodiment the number of the element can be more than one. The term "a" is not construed as a limitation of quantity.

Referring to FIG. 1 to FIG. 35 of the drawings according to a preferred embodiment of the present invention, a manufacturing equipment 300 for molded circuit board assembly 10 of camera module 100 and manufacturing method thereof is illustrated. The manufacturing equipment 300 for molded circuit board assembly 10 of camera module 100 is used to manufacture the molded circuit board assembly 10 of the camera module 100.

Figure 1:
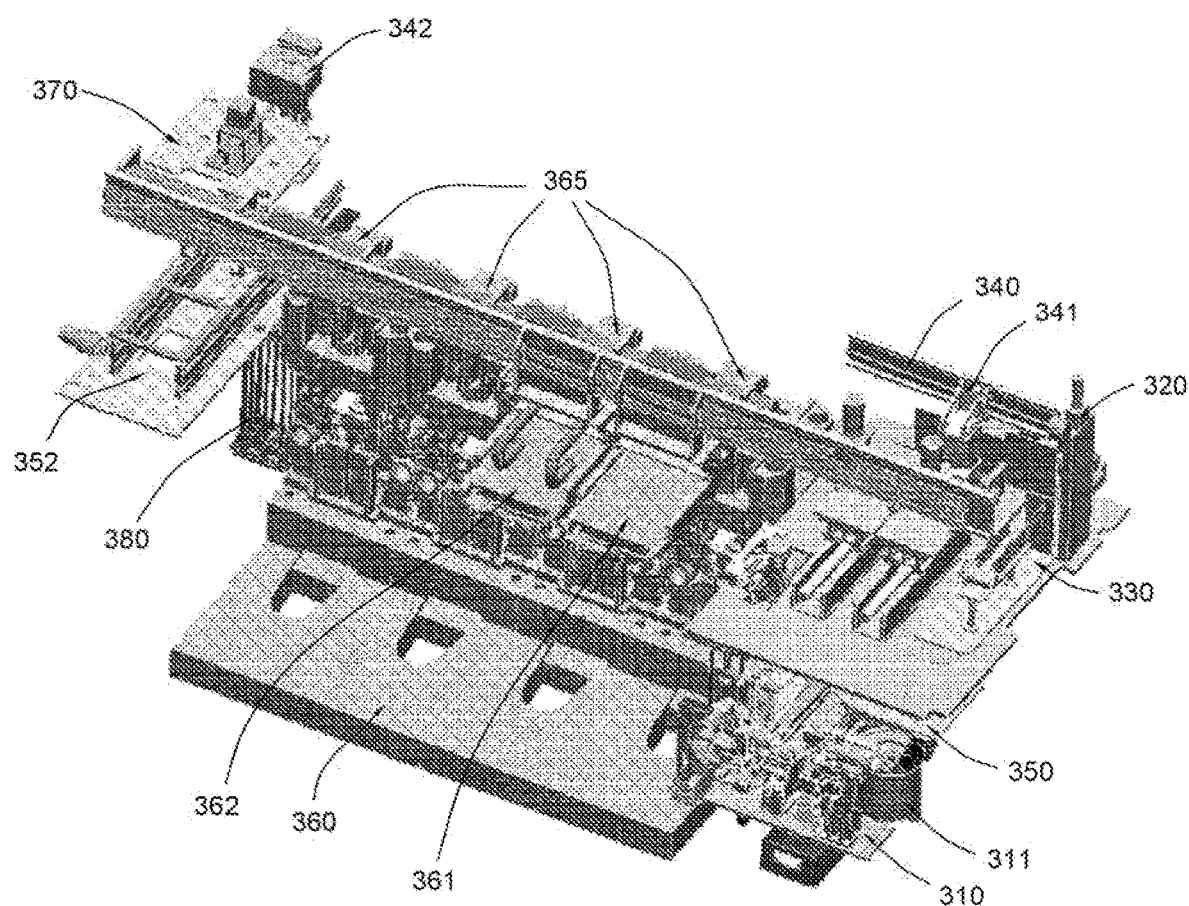
FIG. 1 is a perspective view of a manufacturing equipment for a molded circuit board assembly of a camera module according to a preferred embodiment of the present invention.

According to the preferred embodiment of the present invention as shown in FIG. 1 of the drawings, a manufacturing equipment 300 for manufacturing a molded circuit board assembly 10 of a camera module 100 is illustrated. A module supporting frame 12 with a light window 121 is integrally molded on a substrate board 11 by the manufacturing equipment 300 for molded circuit board assembly 10 of camera module 100 using molding material. During a manufacturing process, other components of the camera module 100 except for the molded circuit board assembly 10 can be prepared at first and then be installed with the molded circuit board assembly 10 using the manufacturing equipment for molded circuit board assembly of camera module 300, or the molded circuit board assembly 10 of the camera module 100 can be formed using the manufacturing equipment 300 for molded circuit board assembly 10 of camera module 100 at first and then the molded circuit board assembly 10 is installed with other components. In the preferred embodiment of the present invention, the molded circuit board assembly 10 of the camera module 100 is manufactured using the manufacturing equipment 300 for the molded circuit board assembly 10 of camera module 100 at first and then the camera module 100 is installed with other components. One skilled in the art will understand that orders for manufacturing the camera module 100 in the preferred embodiment of the present invention are exemplary only and not intended to be limiting.

According to the preferred embodiment of the present invention, the molding material of the module supporting frame 12 integrally manufactured by the manufacturing equipment 300 can be embodied as resin material and the forming techniques for which is thermosetting. Thus, more specifically, the module supporting frame 12 is made of epoxy resin material as an example in the preferred embodiment. However, one skilled in the art should understand that the thermosetting process and the resin material in the preferred embodiment of the present invention above are only exemplary. In addition, the module supporting frame 12 can be made by hot-melting material or be made of other materials, the present invention is not intended to be limiting in this aspect.

Specifically, the manufacturing equipment 300 for molded circuit board assembly of camera module comprises a material unit 310, a substrate board inputting unit 320, a feeding unit 330, a picking and placing unit 340, a transporting unit 350, a molding unit 360, a cutting unit 370 and an outputting unit 380.

Figure 6:
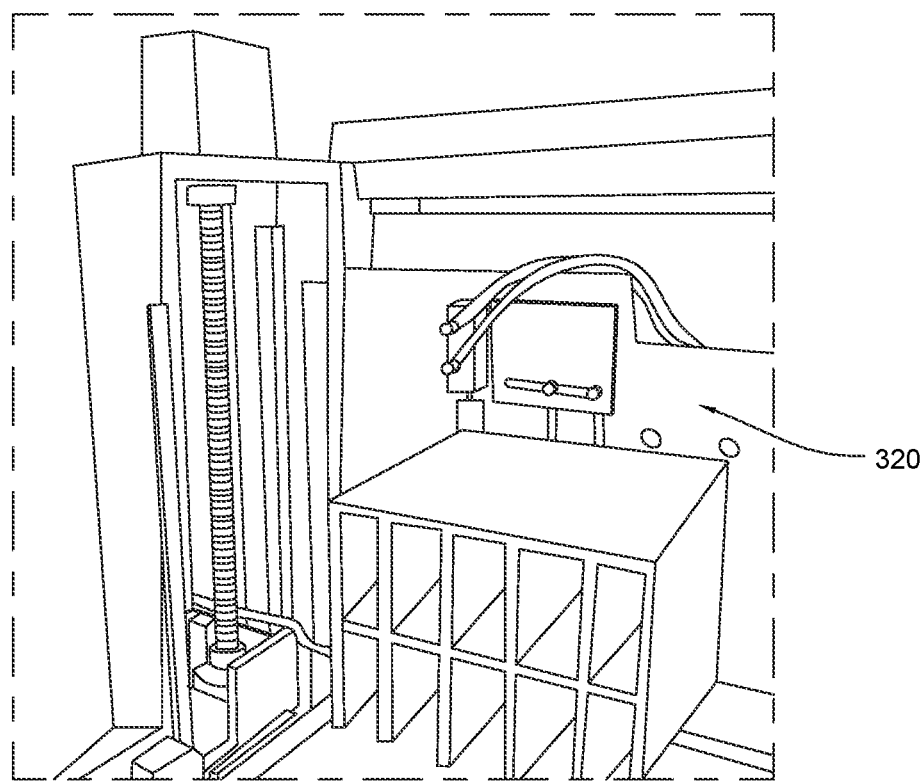
FIG. 6 to FIG. 18 are perspective views of unit components of the manufacturing equipment for the molded circuit board assembly of the camera module according to the above preferred embodiment of the present invention.

The substrate board inputting unit 320 is configured for providing the molded circuit board assembly 10 without the module supporting frame 12. In other words, one or more substrate boards 11 are placed in the substrate board inputting unit 320. In order to meet the requirement of quantity production, for example, as one mould of the molding unit 360 can be disposed with two pieces of board array and each of the pieces of board array can be formed with a plurality of substrate boards 11, a plurality of module supporting frames 12 of the molded circuit board assemblies 10 can be molded and cut in the mould unit 320 at a time, thereby increasing production efficiency. One skilled in the art should understand that the production number of the molded circuit board assembly 10 with the module supporting frame 12 is exemplary only and not intended to be limiting the scope of the invention. As shown in FIG. 6 of the drawings, a plurality of uncut substrate board arrays 1100 having the plurality of substrate boards 11 can be stacked at the substrate board inputting unit 320 such that the feeding unit 330 provides the desired substrate board arrays 1100 to the picking and placing unit 340 each time. It is worth mentioning that the substrate board inputting unit 320 and the outputting unit 380 in the embodiment of the present invention are embodied as material magazines, which are convenient in receiving the substrate board arrays 1100 and the manufactured molded circuit board assemblies 10. One skilled in the art will understand that the substrate board inputting unit 320 and the outputting unit 380 are embodied as other receiving members in other embodiments.

Figure 2:
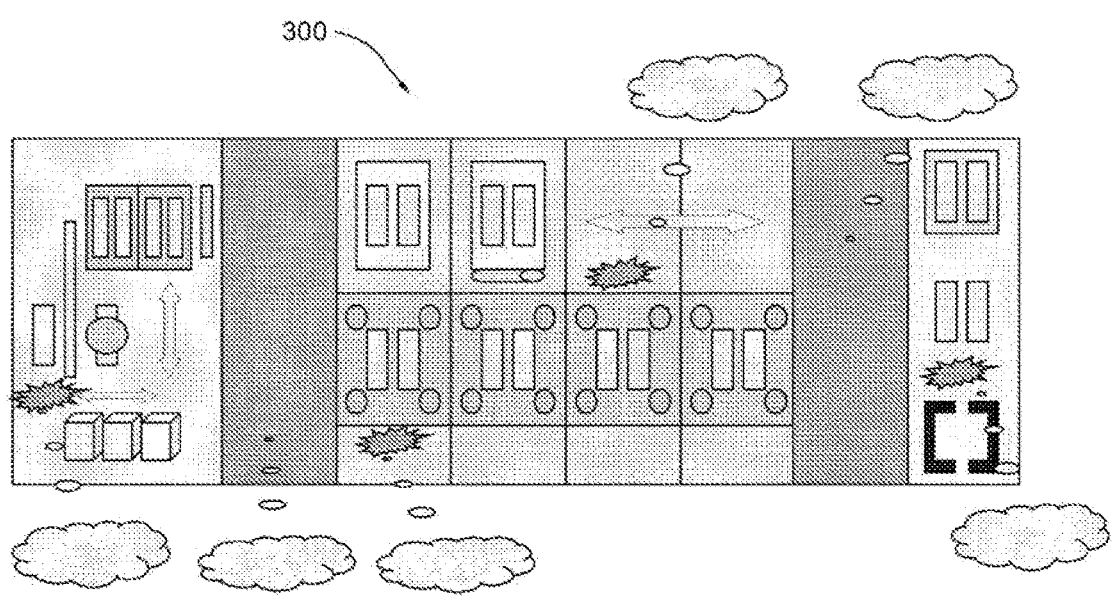
FIG. 2 is a schematic view of the manufacturing equipment for the molded circuit board assembly of the camera module according to the above preferred embodiment of the present invention.
Figure 7:
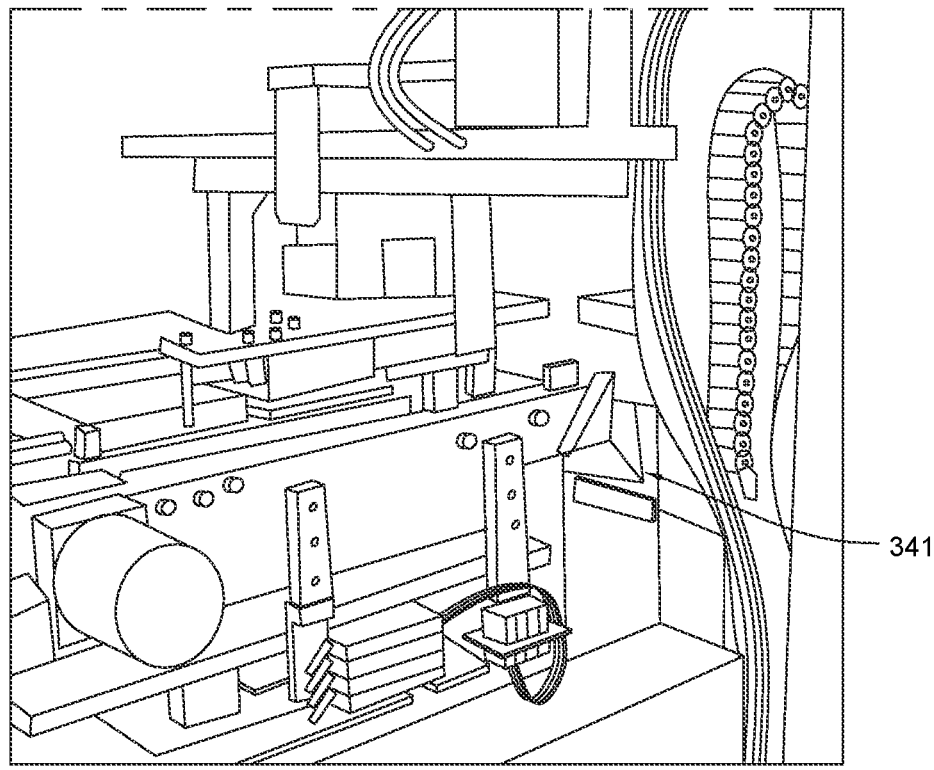
Figure 8:
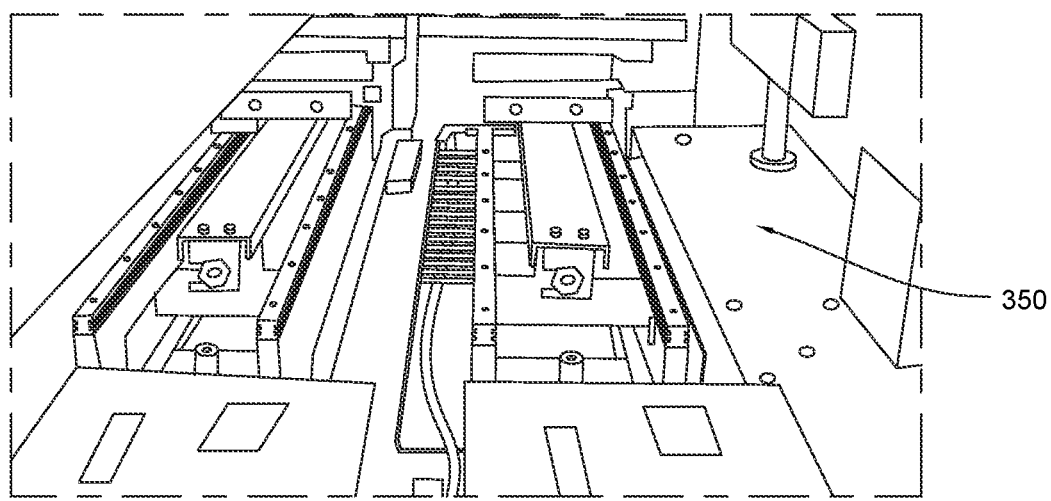
Figure 9:
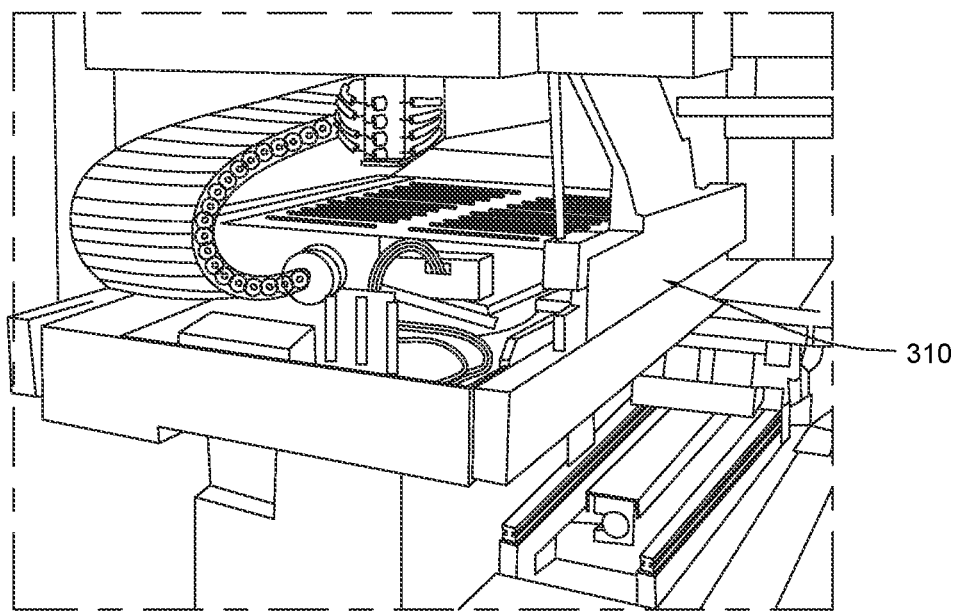
Figure 10:
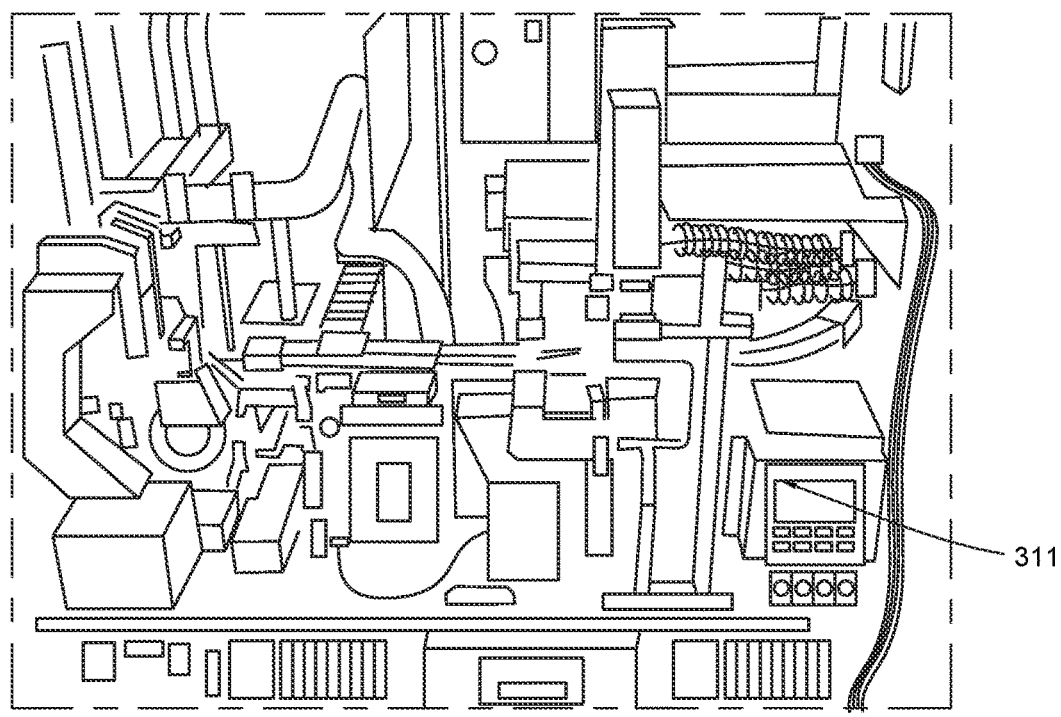
Figure 11:
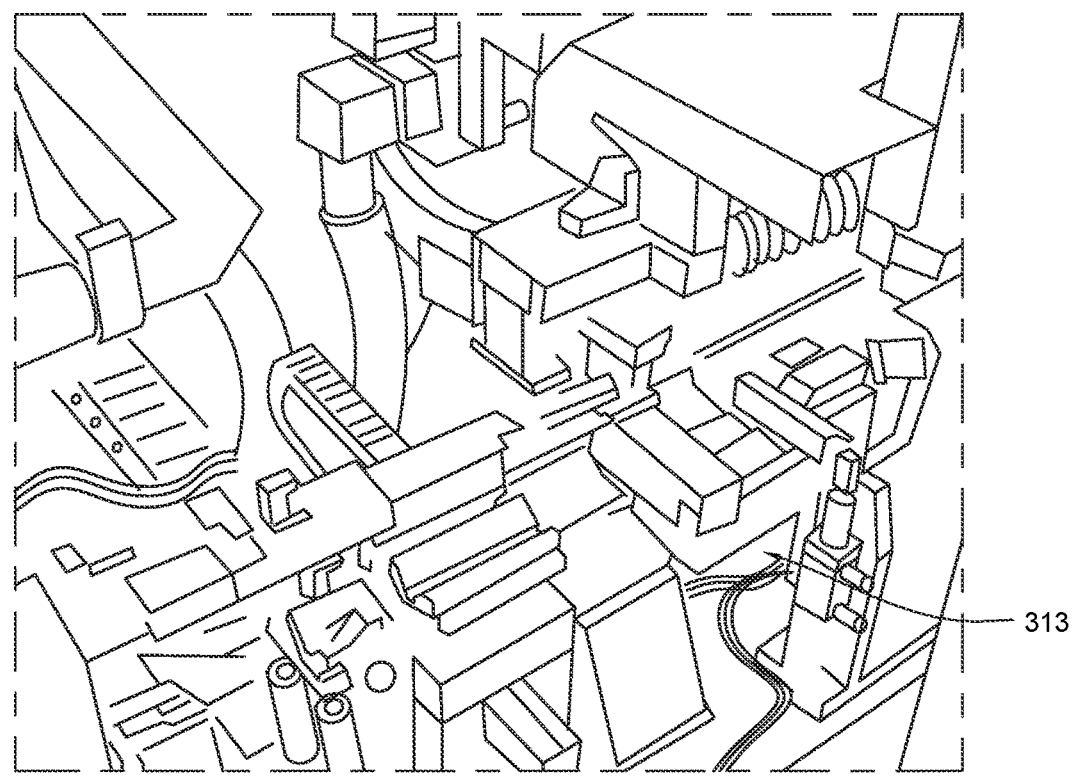
Figure 12:
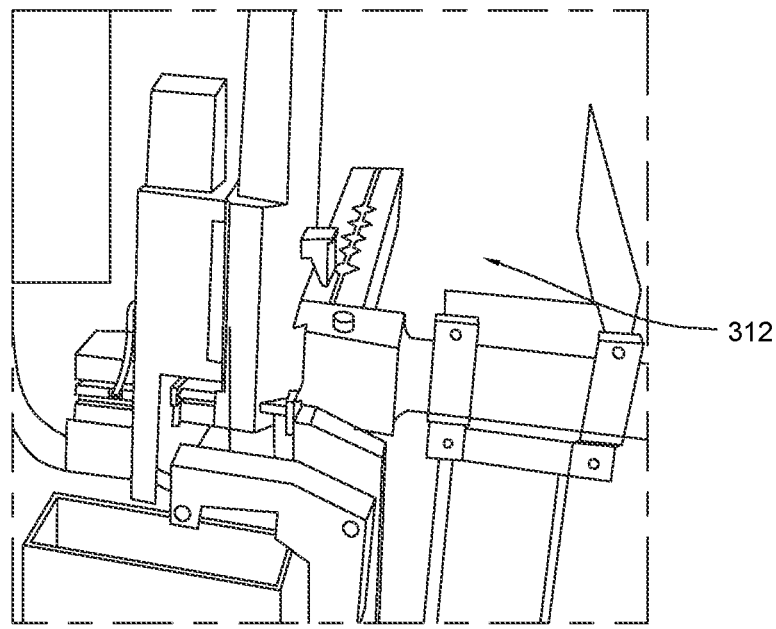
Figure 13:
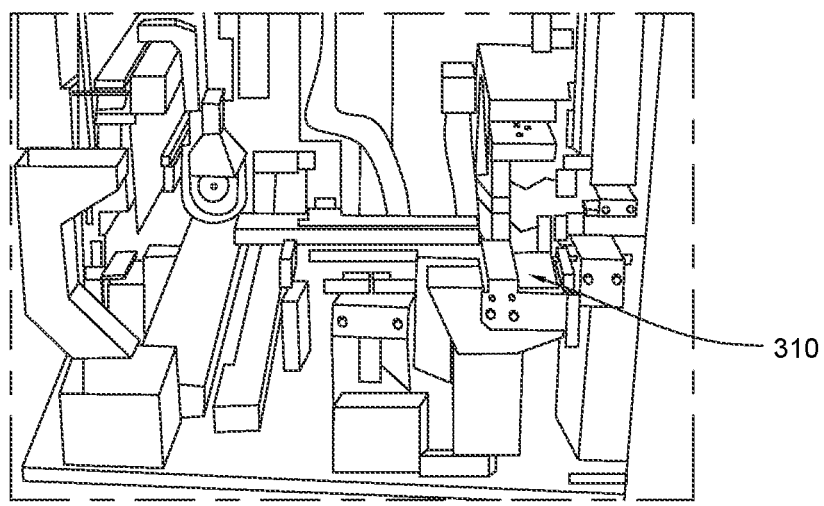
Figure 14:
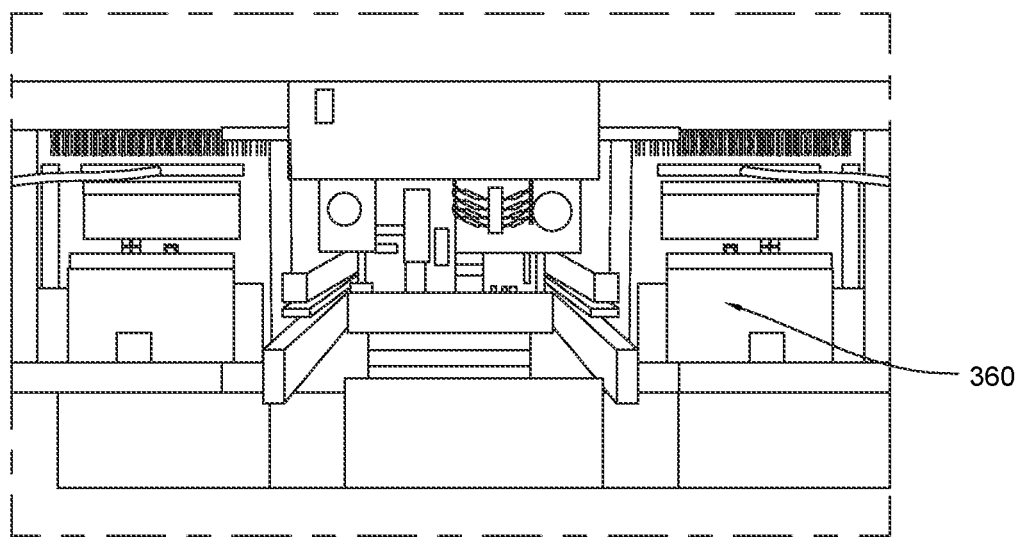

After the feeding unit 330 supplies the substrate board arrays 1100 which is used to manufacture the module supporting frame 12 to the picking and placing unit 340 as shown in FIG. 7 of the drawings, a first picking and placing arrangement 341 of the picking and placing unit 340 picks up the substrate board arrays 1100 and places the substrate board arrays 1100 on the transporting unit 350 in a predetermined order as shown in FIG. 1 of the drawings. The predetermined order of the substrate board arrays 1100 is embodied as the order as shown in FIG. 2 of the drawings according to the embodiment of the present invention. One skilled in the art will understand that the predetermined order can be embodied as other pre-arranged order in other embodiment according to practical requirements and the predetermined order above is exemplary only and is not intended to be limiting.

More specifically, as shown in FIG. 9 to FIG. 13 of the drawings, the material unit 310 is configured for supplying the resin material to form the module supporting frame 12. The material unit 310 further comprises a material supplying member 311, a material transporting member 312 and a material controlling member 313. The material supplying member 311 stores and supplies the resin material and the material transporting member 312 transports the resin material in the material supplying member 311. The material controlling member 313 controls an output quantity of the resin material to avoid superfluous resin material being used during the manufacturing process of the module supporting frame 12 and to avoid a wasting of the resin material and polluting other components. According to the embodiment of the present invention, the material controlling member 313 is embodied as a material weighing member and controls the weight of the needed resin material of the module supporting frame 12 through weighing the resin material. One skilled in the art would understand that the material controlling member 313 can also be embodied as a time controller or a pressure controller in other embodiments. In other words, the quantity of the resin material to form the module supporting frame 12 at each time can also be controlled by controlling a supplying time or a supplying pressure of the resin material at each time and is not intended to be limiting.

According to the preferred embodiment of the present invention, as the resin material forming the module supporting frame 12 is suitable for heat curing, before the resin material is fully solidified to form the module supporting frame 12, the resin material can be in a fluid state, or in a solidifiable semisolid-semifluid state. The transporting unit 350 transports the substrate board arrays 1100 to the molding unit 360 for being integrally molded into the module supporting frame 12.

Figure 3:
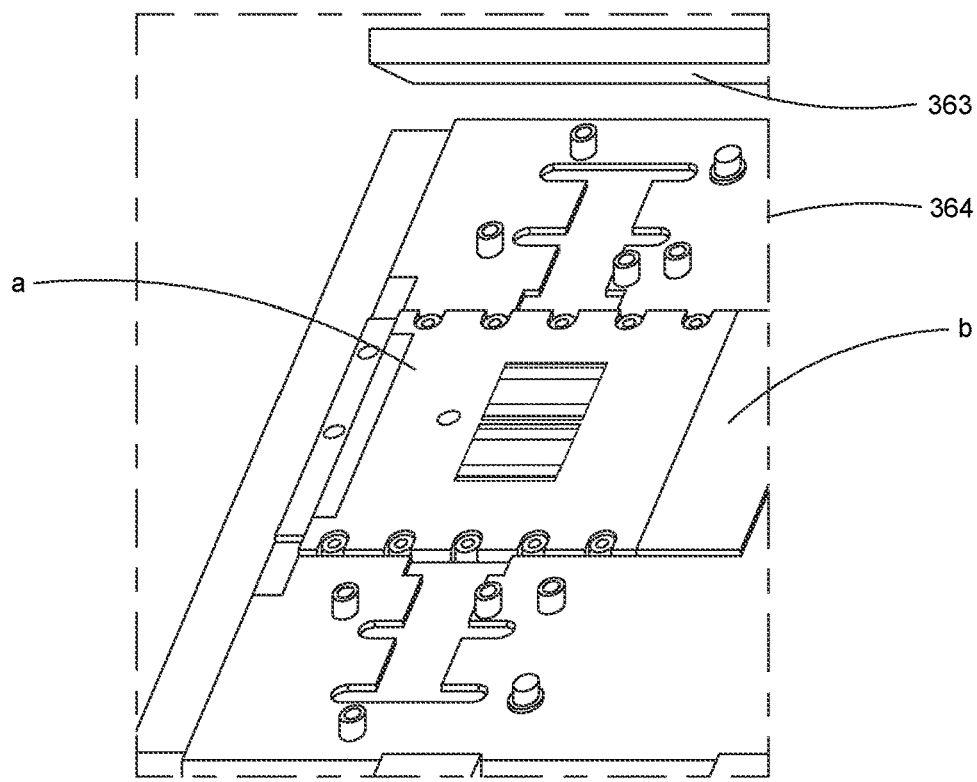
FIG. 3 is a perspective view of an upper mould and a lower mound of the manufacturing equipment for the molded circuit board assembly of the camera module according to the above preferred embodiment of the present invention.
Figure 4:
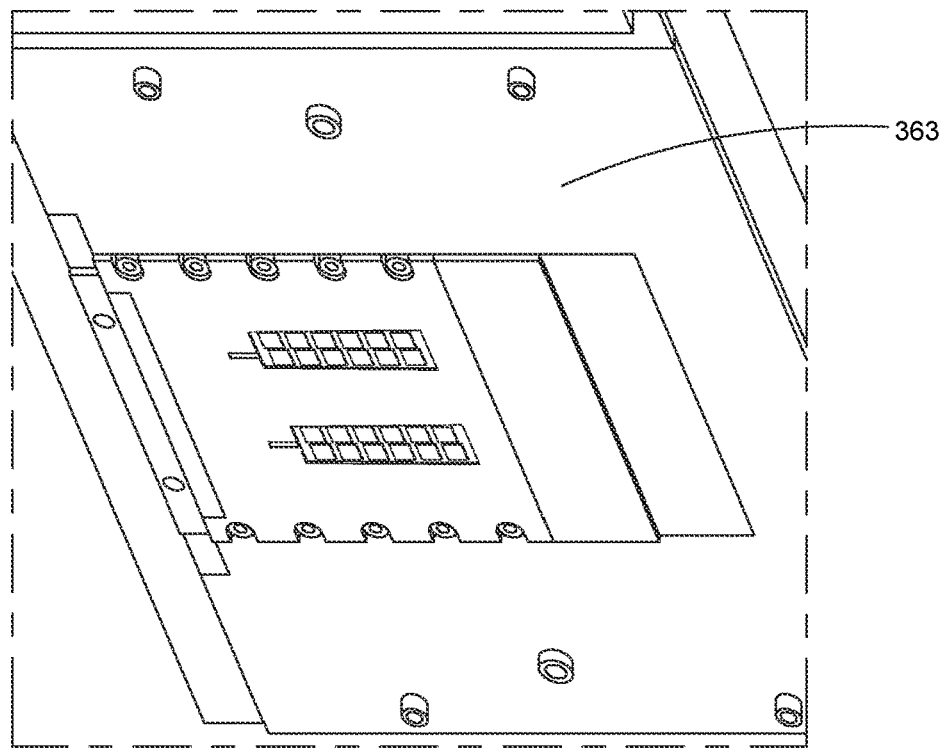
FIG. 4 is a perspective view of the upper mould of the manufacturing equipment for the molded circuit board assembly of the camera module according to the above preferred embodiment of the present invention.

Furthermore, as shown in FIG. 1, FIG. 3 and FIG. 4 of the drawings, the molding unit 360 further comprises a loading platform 361, an uploading platform 362, an upper mould 363, a lower mould 364 and a pressing member 365. A molding cavity 3600 is formed between the loading platform 361 and the uploading platform 362. The module supporting frames 12 are formed in the molding cavity 3600. A shape of the molding cavity 3600 is arranged to match with a shape of the module supporting frames 12. The lower mould 364 is provided on the loading platform 361. The lower mould 364 has a substrate board placing region a and a material placing region b. The substrate boards 11 are placed on the substrate board placing region a and an uncured molding material 1200 is placed on the material placing region b. The molding material 1200 is embodied as a resin material in the embodiment of the present invention. The pressing member 365 controls the opening and closing of the lower mould 364 and the upper mould 363. One skilled in the art should understand that the substrate board placing region a and the material placing region b being formed on the lower mould 364, and the positions of the substrate board placing region a and the material placing region b above are only exemplary and are not intended to be limiting. In addition, according to the preferred embodiment of the present invention, the upper mould 363 is fixed and unmovable, and the lower mould 364 is provided on the loading platform 361 and is moveable. The module supporting frames 12 are integrally molded in the upper mould 363. One skilled in the art will understand that in the preferred embodiment of the present invention the upper mould 363 is fixed, the lower mould 364 is moveable and the module supporting frame 12 is solidified and molded in the upper mould 363. However, in other embodiments, the upper mould 363 is movable, the lower mould 364 is fixed and the module supporting frame 12 is solidified and molded in the lower mould 364, while in other embodiments the upper mould 363 and the lower mould 364 are both moveable, thereby the present invention is not intended to be limiting. It is worth mentioning that the opening and closing of the upper mould 363 and the lower mould 364 are controlled by the pressing member 365 in this preferred embodiment. However, one skilled in the art should understand that the opening and closing of the upper mould 363 and the lower mould 364 are controlled by a mould fixation arrangement. In other words, the mould fixation arrangement is embodied as the pressing member 365 in the preferred embodiment. The mould fixation arrangement also further controls the opening and closing of the upper mould 363 and the lower mould 364 by a driving element, the present invention is not intended to be limiting.

More specifically, the material is quantitatively controlled by the material controlling member 313, then the material transporting member 312 transports quantitative material to a material discharging element 314, wherein the lower mould 364 has at least one material discharging chute 3640. The material discharging element 314 is received in the material discharging chute 3640. The material discharging element 314 has at least one plunger piston 3641. The plunger piston 3641 pushes the molding material 1200 which is embodied as the resin material into the molding cavity 3600. After the molding material 1200 is solidified, the module supporting frame 12 is formed in the molding cavity 3600. In other words, the lower mould 364 is loaded with the molding material 1200 and the substrate board arrays 1100, when the upper mould 363 and the lower mould 364 are enclosed by the controlling of the pressing member 365, the molding material 1200 fulfills the molding cavity 3600 so as to form the module supporting frames 12 after solidification.

In other words, the shape of the molding surface of the molding cavity 3600 is matched with the shape of the molded circuit board assembly 10. When the molding material 1200 is fulfilled into the molding cavity 3600 from the material discharging element 314, an outer surface of the molding material 1200 within the molding cavity 3600 fits to the mold surface of the molding cavity 3600, such that the molding material 1200 within the molding cavity 3600 forms the module supporting frames 12 after solidification.

Figure 5:
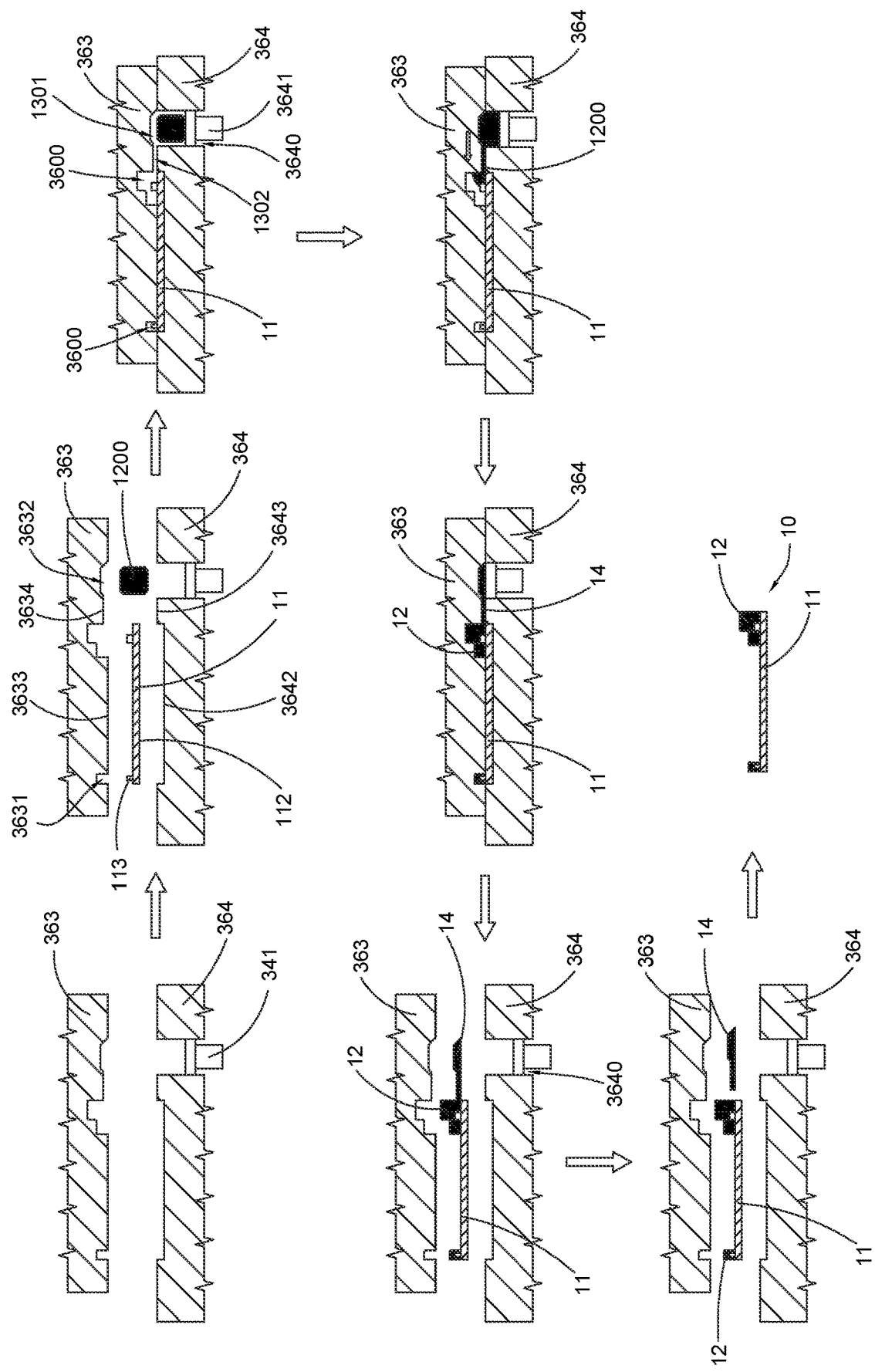
FIG. 5 is a schematic view of a manufacturing method of manufacturing the molded circuit board assembly of the camera module according to the above preferred embodiment of the present invention.

More specifically, for example, in this preferred embodiment of the present invention, as shown in FIG. 5 of the drawings, each of the substrate boards 11 further comprises a circuit board 112 and one or more integral circuit electronic components 113. During a MOC (Molding on Chip) process, the substrate boards 11 further comprises a photosensitive element 111 electrically connected to the circuit board 112. The upper mould 363 is defined as a region for forming the module supporting frame. The upper mould 363 further has a supporting frame forming groove 3631, at least one main flow channel groove 3632 and at least one light window forming element 3633. An upper molding surface is defined by each of the supporting frame forming grooves 3631 and each of the light window forming elements 3633. The lower mould 364 has at least one substrate board receiving groove 3642 defining a configuration of at least one lower molding surface and for placing the substrate boards 11. When the upper mould 363 and the lower mould 364 are in a closed-mould state, the contact portion between the upper mould 363 and the lower mould 364 is defined as a contacting portion. The space between the upper molding surface and the lower molding surface forms the molding cavity 3600. In other words, a shape and size of each of the molding cavity 3600 matches with a shape and size of the module supporting frames 12.

In order to improve production efficiency, the substrate board arrays 1100 having the plurality of substrate boards 11 is provided for implementing the integral molding process between the upper mould 363 and the lower mould 364. The main flow channel groove 3632 and the material discharging chute 3640 form a main flow channel 1301. The lower mould 364 further has a sub flow channel bulge 3643 and the upper mould 363 further has at least one sub flow channel protrusion 3634. A sub flow channel 1302 is formed between the sub flow channel bulge 3643 and the sub flow channel protrusion 3634. The molding material 1200 enters the main flow channel 1301 and fulfills the molding cavity 3600 through the sub flow channel 1302, and the module supporting frames 12 is formed after heating and solidifying. The portion of the molding material 1200 which enters the main flow channel 1301, the sub flow channel 1302 and the molding cavity 3600 and which is not forming the module supporting frames 12 is solidified to form a solidified molded extension 14. The solidified molded extension 14 should be separated from the module supporting frames 12 in the subsequent process.

It is worth mentioning that the upper mould 363 and/or the lower mould 364 further may have a forming cavity separating stair. The forming cavity separating stair separates each molding cavity 3600, so that each of the module supporting frames 12 after heating and solidification is independently formed in each of the molding cavities 3600 and each of the module supporting frames 12 would not be sticked together, which is also beneficial to yield improvement.

It is worth mentioning that, as the module supporting frame 12 is formed by heating to be solidified, the upper mould 363 or the lower mould 364 is provided with a heating arrangement. As the heating arrangement heats the molding material 1200 which is embodied as epoxy resin, the molding material 1200 will be heated to be solidified after fulfilling each molding cavity 3600 and will finally form the module supporting frame 12 which has the matched shape with the shape of the molding cavity 3600. One skilled in the art will understand that the molding material 1200 being embodied as epoxy resin in the preferred embodiment of the present invention is exemplary only and not intended to be limiting. In other embodiments, the molding material 1200 is embodied as other material having a thermocuring property. In addition, one skilled in the art would understand that the heating arrangement is also embodied as a temperature controlling arrangement 390, wherein the temperature controlling arrangement 390 is able to control temperature during the manufacturing process, and the present invention is not intended to be limiting the scope with the embodiments.

More specifically, in one embodiment, each of the substrate boards 11 is placed on the lower mould 364, each of the molding material 1200 is placed inside the material discharging chute 3640 of the lower mould 364. The lower mould 364 moves vertically to an underside of the lower mould 364. The upper mould 363 and the lower mould 364 are pressed to close and are in the closed-mould state, the plunger piston 3641 applies a pressure on the molding material 1200, and the molding material 1200 enters each molding cavity 3600. After each molding cavity 3600 is fulfilled with the molding material 1200, each of the molding material 1200 within each of the molding cavity 3600 is heated. In the preferred embodiment of the present invention, the molding material 1200 is heated to 180° C. for a heating time of two minutes, each of the molding material 1200 is gradually heated to be solidified to form the module supporting frame 12. After the upper mould 363 is separated with the lower mould 364, the molded circuit board assemblies 10 formed by the module supporting frames 12 and the substrate boards 11 are removed from the molding unit.

More specifically, as shown in FIG. 5 of the drawings, a method of manufacturing the molded circuit board assembly 10 by the manufacturing equipment for molded circuit board assembly of camera module 300 is illustrated, wherein the method comprises the following steps.

Firstly, the lower mould 364 is moved to an underside of the upper mould 363. The substrate boards 11 and the molding material 1200 are placed at the lower mould 364. The lower mould 364 is pressed closely to the upper mould 363 and the upper mould 363 and the lower mould 364 are in a closed-mould state. The plunger piston 3641 pushes the molding material 1200 into the molding cavity 3600. The molding material 1200 fulfils the molding cavity 3600 and heated to be solidified to form the module supporting frame 12 under 175° C. for two minutes. The module supporting frames 12 and the remained molding material 1200 are removed from the molding unit. The remained molding material 1200 is separated with the module supports 12 and the module supporting frames 12 are continued to be heated under 175° C. for four hours, such that the module supporting frames 12 are eventually solidified and the molded circuit board assembly 10 is manufactured.

One skilled in the art should understand that the disclosed heating temperature and heating time above are exemplary only. The range of the heating temperature is changed according to the material of the molding material 1200 that, for example, the range of the heating temperature in other embodiments is 130-21° C. In other words, the disclosed heating temperature and heating time above are not intended to be limiting.

It is worth mentioning that the manufacturing equipment for molded circuit board assembly of camera module 300 further comprises a pre-heating arrangement, wherein the pre-heating arrangement preheats the substrate board arrays 1100 before the module supporting frame 12 is integrally molded so as to reduce the overall heat curing time of the module supporting frame 12 inside the molding cavity 3600 and to improve the productivity of the camera module 100.

It is worth mentioning that, after the upper mould 363 and the lower mould 364 are pressed together and in the closed-mould state, each molding cavity 3600 can be converted to a vacuum state by means of a vacuum extractor to increase a flow rate of the molding material 1200 entering the molding cavity 3600, thereby further reducing a time of the molding material 1200 fulfilling the molding cavity 3600 and improving the productivity of the molded circuit board assembly 10 of the camera module 100.

It is worth mentioning that, the flow rate of the molding material 1200 entering the molding cavity 3600 is not suitable for too fast and, when the integrated circuit electronic components 113 are fragile, the molding cavity 3600 may further has a plurality of air vents in the closed-mould state. During a process of the plunger piston 3641 pushing the molding material 1200 entering the molding cavity 3600, the original air within the molding cavity 3600 is discharged to outside via the air vents, so that the molding material 1200 can be fulfilled in the molding cavity 3600 and then each module supporting frame 12 is integrally molded.

Furthermore, after the module supporting frame 12 is integrally formed by the molding material 1200, the upper mould 363 is separated with the lower mould 364 and the substrate board arrays 1100 with the molded module supporting frame 12 are placed on the uploading platform 362. In other words, the substrate board arrays 1100 with the molded module supports 12 are defined as an uncut molded circuit board assembly combination. The picking and placing unit 340 transports the uncut molded circuit board assembly combinations on the uploading platform 362 to a second picking and placing arrangement 342 of the picking and placing unit 340. The second picking and placing arrangement 342 picks up the uncut molded circuit board assembly combinations and places the uncut molded circuit board assembly combinations on the cutting unit 370. The cutting unit 370 cuts the uncut molded circuit board assembly combinations into independent molded circuit board assemblies 10. During the cutting process, the solidified and remained molding material 1200, which is not formed a part of the module supporting frame 12, is separated from the molded module supporting frame 12 by the cutting unit 370. The transporting unit 350 transports the molded circuit board assemblies 10 from a transporting outlet 352 to the outputting unit 380, so that the molded circuit board assemblies 10 of the camera module 100 are manufactured by the manufacturing equipment 300.

Figure 15:
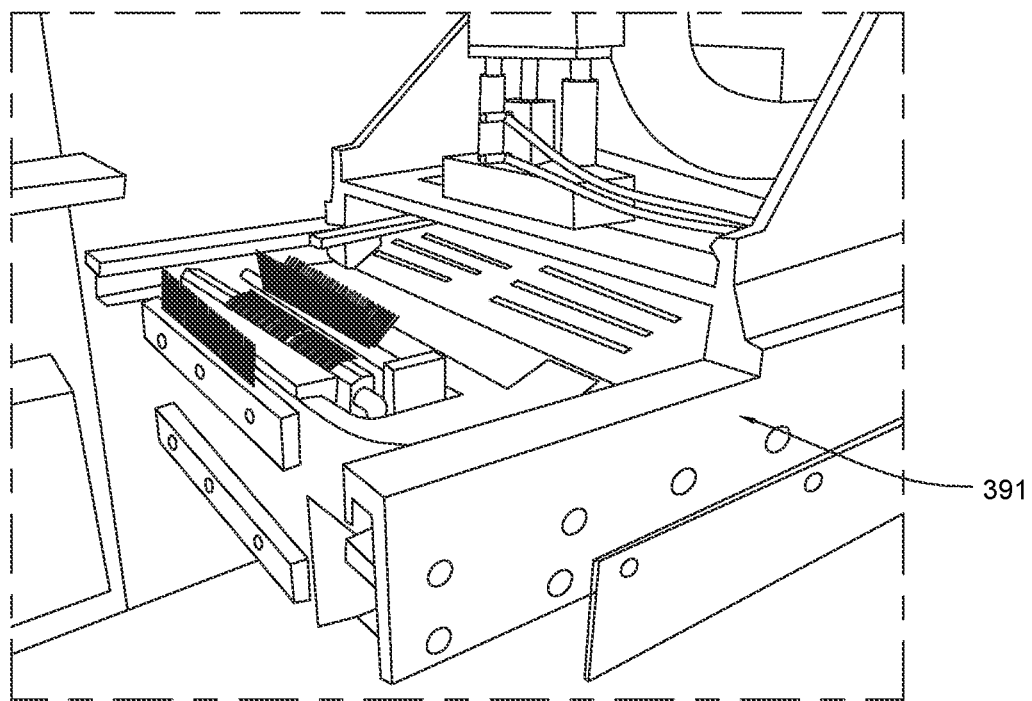

It is worth mentioning that, as shown in FIG. 15, the manufacturing equipment 300 further comprises a cleaning arrangement 391. After the molded circuit board assemblies with the module supporting frames 12 are taken out from the upper mould 363 and the lower mould 364, the cleaning arrangement 391 is able to clean the upper mould 363 and the lower mould 364 to facilitate the continuous use of the upper mould 363 and the lower mould 364.

Figure 16:
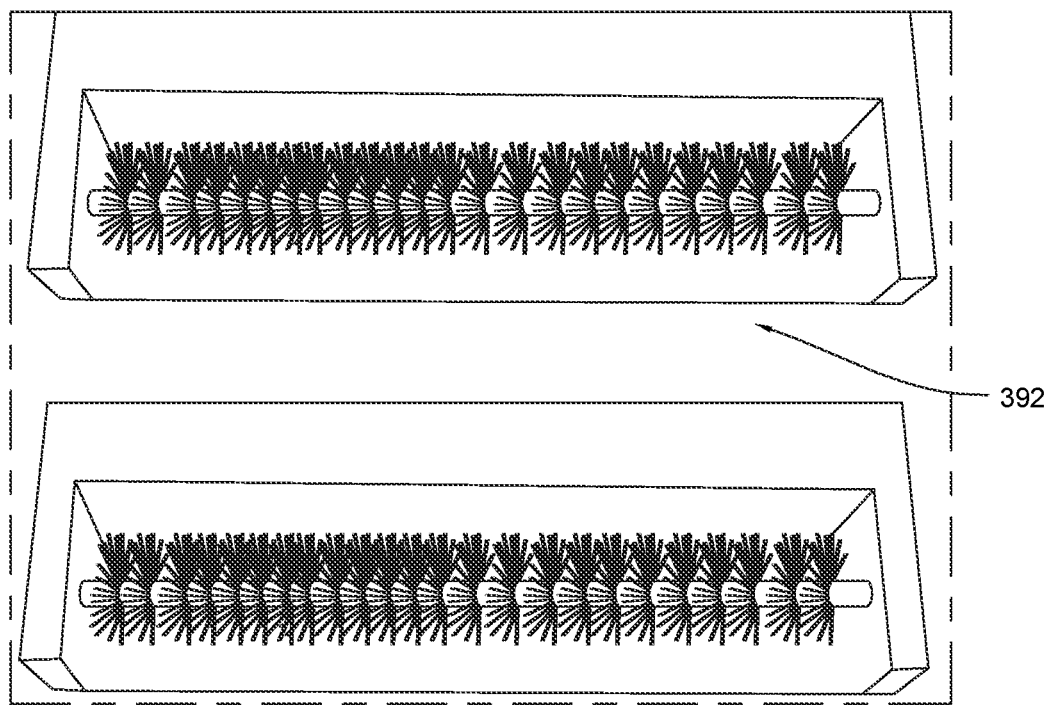
Figure 17:
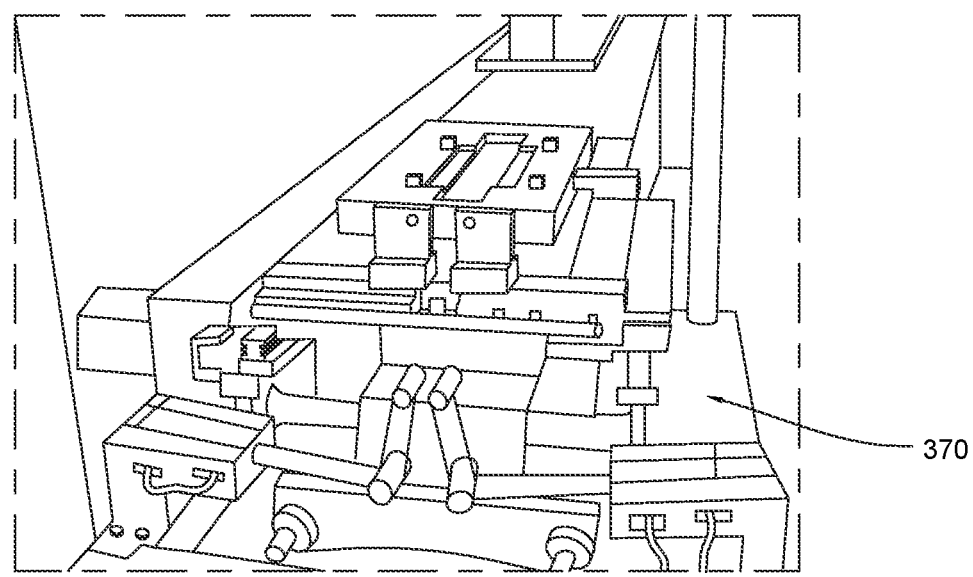
Figure 18:
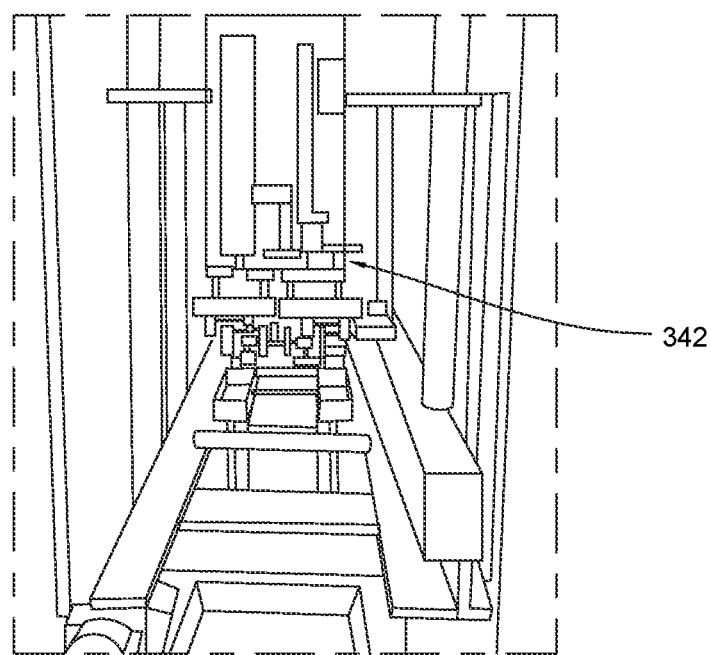
Figure 19:
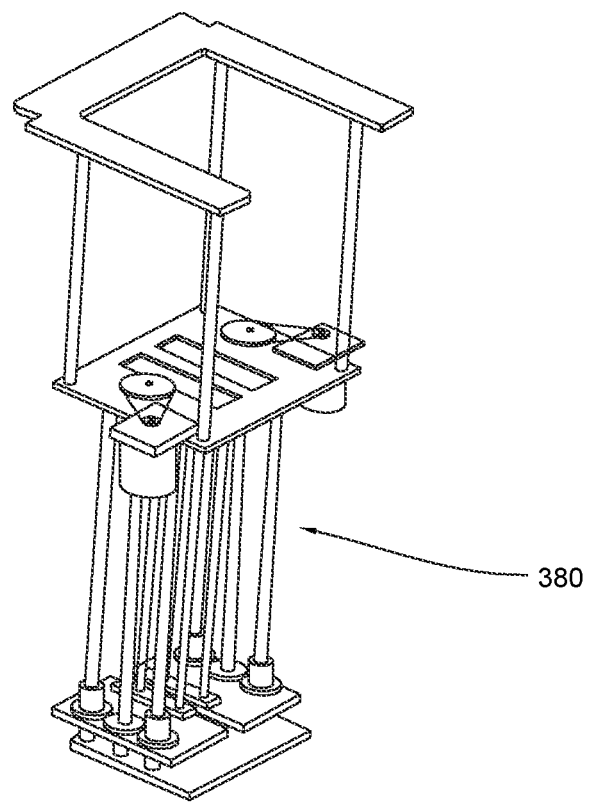
FIG. 19 is a perspective view of an outputting unit of the manufacturing equipment for the molded circuit board assembly of the camera module according to the above preferred embodiment of the present invention.

It is worth mentioning that shown in FIG. 16, the manufacturing equipment 300 further comprises a sweeping arrangement 392 embodied as a rolling brush, wherein the sweeping arrangement 392 is able to sweep the loading platform 361 and the uploading platform 362 in time.

It is worth mentioning that, the cleaning arrangement 391 and the sweeping arrangement 392 can be implemented as rolling brushes for cleaning gaps easily. In addition, the cleaning arrangement 391 and the sweeping arrangement 392 can be replaced by fans to fulfill the cleaning and sweeping purpose.

One skilled in the art would understand that the cleaning arrangement 391 and the sweeping arrangement 392 in the preferred embodiment of the present invention are exemplary only and not intended to be limiting the scope of the invention.

A method of manufacturing the module supporting frame 12 of the molded circuit board assembly 10 of the camera module 100 by the manufacturing equipment 300 comprises the following steps.

(1) The feeding unit 330 supplies the substrate board arrays 1100 with the plurality of substrate boards 11 to the first picking and placing arrangement 341 of the picking and placing arrangement 340.

(2) The first picking and placing arrangement 341 of the picking and placing unit 340 picks up the substrate board arrays 1100 and places the substrate board arrays 1100 on the transporting unit 350 in a predetermined arranging order.

(3) The transporting unit 350 transports the substrate board arrays 1100 to the molding unit 360.

(4) The material unit 310 quantificationally transports the molding material 1200 to the molding unit 360.

(5) The molding unit 360 integrally molds the molding material 1200 on the substrate boards 11 of the substrate board arrays 1100 and the module supporting frames 12 are formed.

(6) The picking and placing unit 340 transports the uncut molded circuit board assembly arrays 1300 on the molding unit 360 to the second picking and placing arrangement 342 of the picking and placing unit 340.

(7) The second picking and placing arrangement 342 picks up the uncut molded circuit board assembly arrays and places the uncut molded circuit board assembly arrays on the cutting unit 370.

(8) The cutting unit 370 cuts down the solidified molded extension 14 which is not forming the module supporting frames 12 from the uncut molded circuit board assembly arrays and also cuts the uncut molded circuit board assembly arrays into independent molded circuit board assemblies 10.

(9) The transporting unit 350 transports the molded circuit board assemblies 10 to the outputting unit 380 from the transporting outlet 352.

Figure 34:
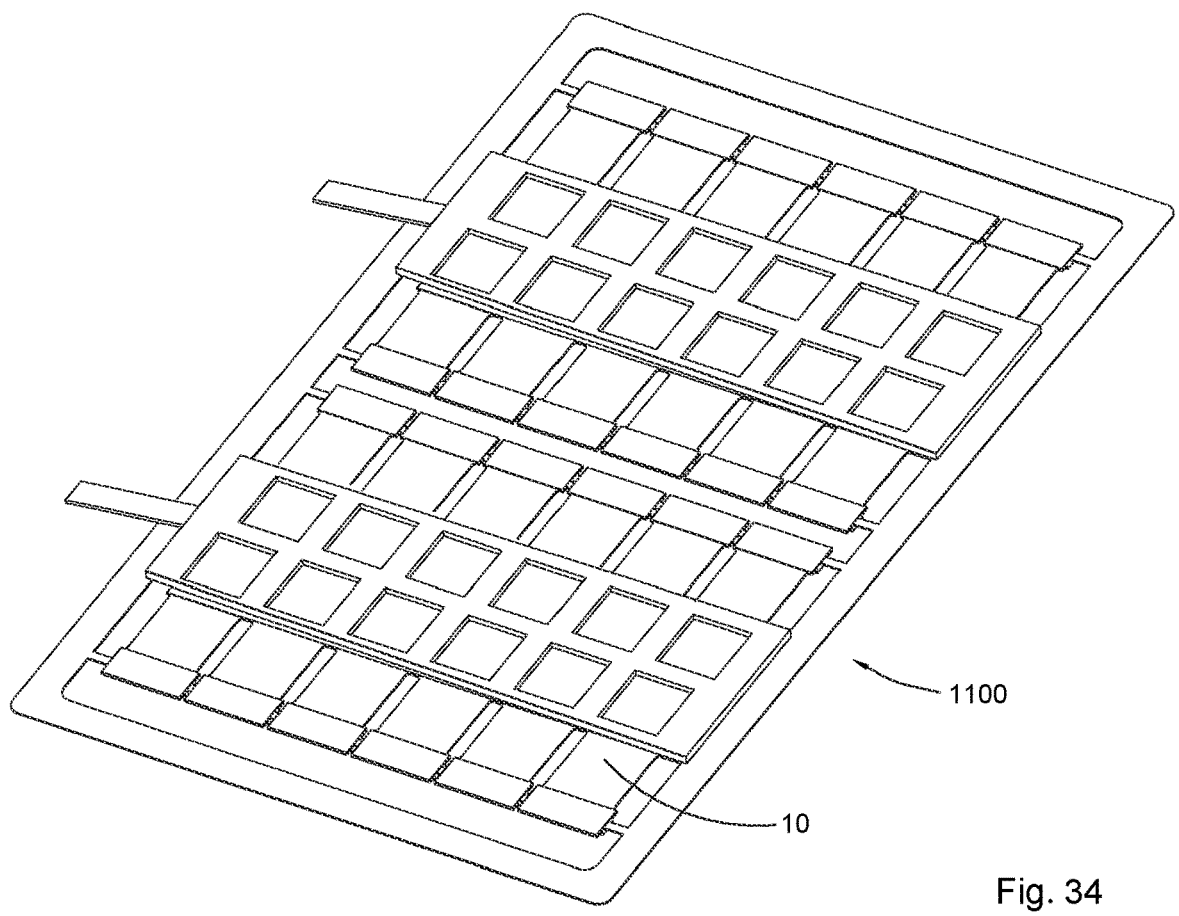
FIG. 34 is a perspective view of a molded circuit board assembly combination according to the above preferred embodiment of the present invention.
Figure 35:
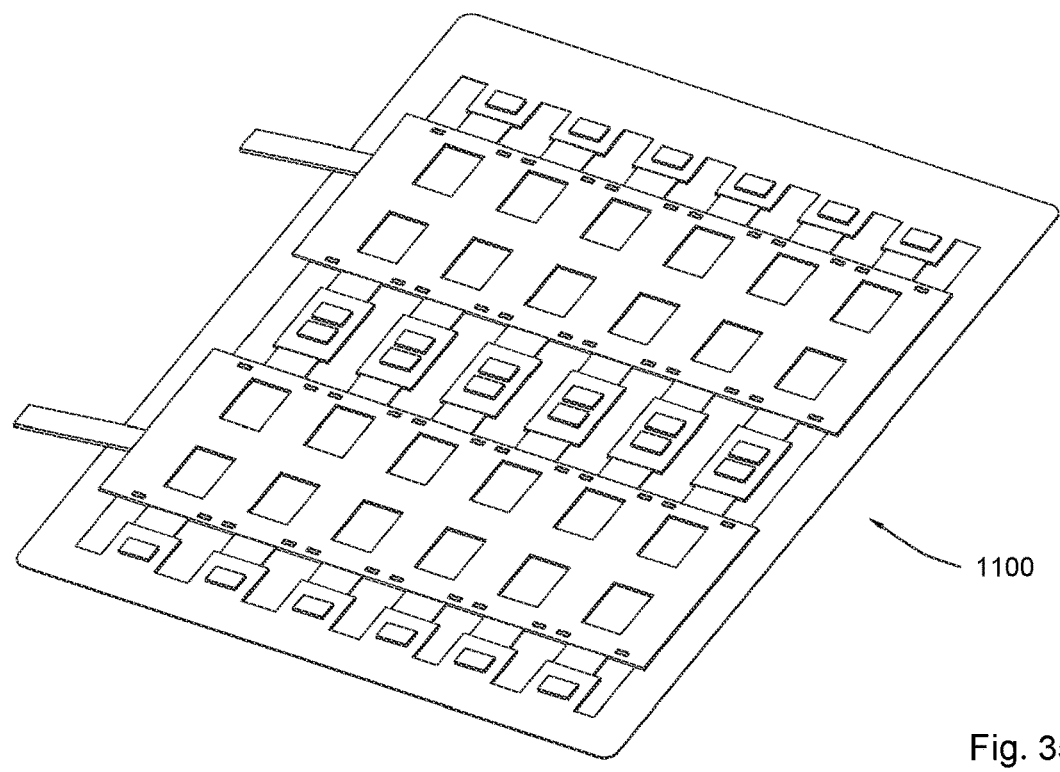
FIG. 35 is a perspective view of a molded circuit board assembly combination according to the above preferred embodiment of the present invention.
Figure 36:
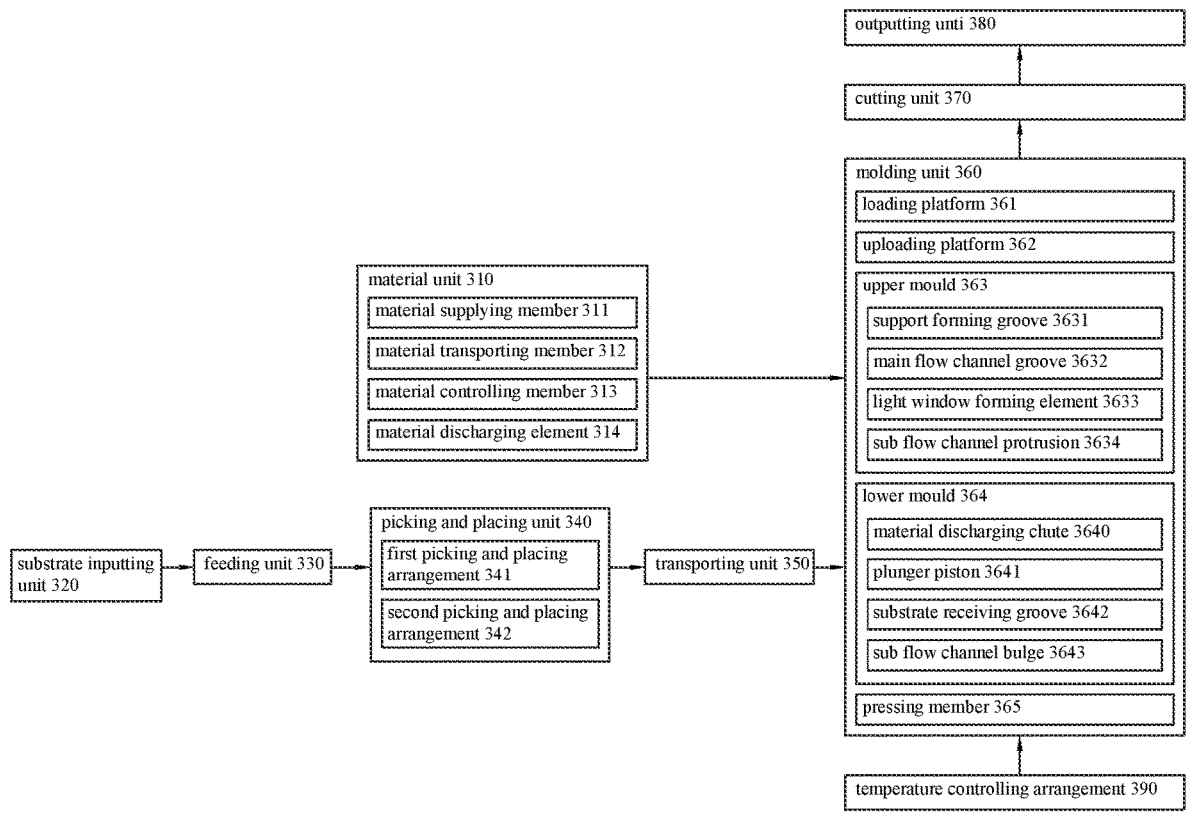
FIG. 36 is a block diagram of the manufacturing equipment for the molded circuit board assembly of the camera module according to the above preferred embodiment of the present invention.
Figure 37:
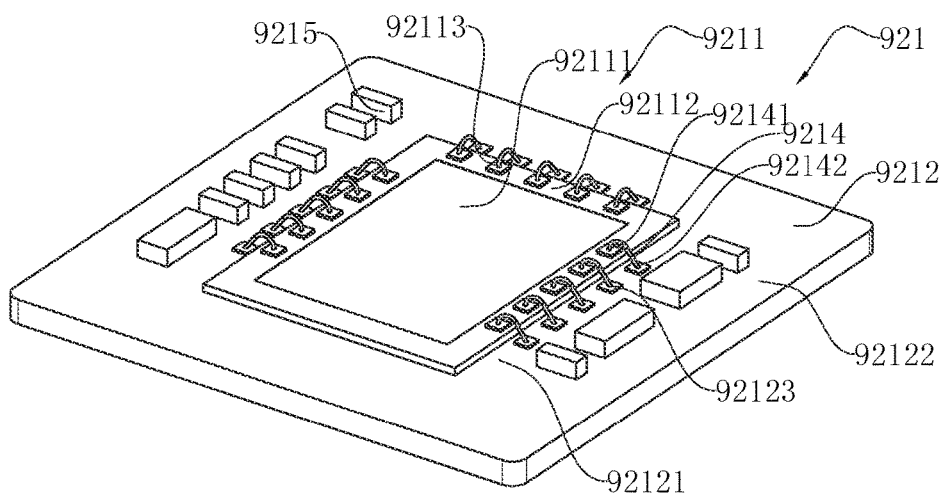
FIG. 37 is a perspective view of an imaging assembly of the molded circuit board assembly according to the above preferred embodiment of the present invention.

FIG. 34 and FIG. 35 illustrate the molded circuit board assembly arrays 1300 in two embodiments which are respectively based on a MOC (Molding on Chip) process and a MOB (Molding on Board) process. Wherein the two molded circuit board assembly combinations 1300 are respectively defined as a MOC combing board and a MOB combing board. One skilled in the art would understand that the molded circuit board assembly combinations 1300 as shown in FIG. 34 and FIG. 35 also have other alternative modes that the present invention is not intended to be limiting by the preferred embodiments. FIG. 35 is a perspective view of the MOB board array.

It is worth mentioning that, after the step (5), the solidified molded extension 14 also can be cut from the molded circuit board assembly array 1300 at first and then the molded circuit board assembly array 1300 is cut into the independent molded circuit board assemblies 10. One skilled in the art would understand that during the manufacturing method the order of separating the solidified molded extension 14 and the module supporting frames 12 can be changed, the present invention is not intended to be limiting.

It is worth mentioning that, in the step (8), the molded circuit board assembly array 1300 without the solidified molded extension 14 can also not be cut into the molded circuit board assemblies 10 and is directly transported to the outputting unit 380, the present invention is not intended to be limiting.

Furthermore, the step (5) further comprises the following steps:

(a) The lower mould 364 is moved to the underside of the upper mould 363.

(b) The material discharging element 314 supplies the molding material 1200 and the substrate board arrays 1100 is transported to the lower mould 364.

(c) The lower mould 364 is pressed closely to the upper mould 363 and the upper mould 363 and the lower mould 364 are in the closed-mould state.

(d) The plunger piston 3641 pushes the molding material 1200 into the molding cavity 3600.

(e) The molding material 1200 fulfills each molding cavity 3600.

(f) The heating arrangement transforms quantity of heat to the molding material 1200 by the plunger piston 3641.

(g) The molding material 1200 is heated to be solidified to form the module supporting frame 12 within each molding cavity 3600 and the solidified molded extension 14 within the sub flow channel 1302.

(h) The module supporting frame 12 and the solidified molded extension 14 are taken out.

In which, the step (e) illustrates a manner for the molding material 1200 to enter into each molding cavity 3600. The molding material 1200 can also enters into each molding cavity 3600 by vacuum decompression of the molding cavity 3600 disclosed above or increasing pressure of outside of the molding cavity 3600 or other practical ways, the present invention is not intended to be limiting.

In which, the heating manner in the step (g) is illustrated to be heating and solidifying the module supporting frame 12 within each molding cavity 3600 by a thermal conduction of the heating arrangement, while in other embodiments the module supporting frame 12 within the molding cavity 3600 can be heated by other ways, such as heating the upper mould 363 and so on, and that the present invention is not intended to be limiting by the embodiments.

In which, between the step (c) and the step (d), it can further includes a step of reducing the pressure of air within the molding cavity 3600. The pressure reducing step can decrease the time of the step (c) and the step (d) and the molding material 1200 is easier to fulfill the molding cavity 3600.

In which, when the upper mould 363 is movable. In other words, when the lower mould 364 is a product forming region, the moving and pressing order of the upper mould 363 and the lower mould 364 in the step (a) and the step (c) can be changed, and that the present invention is not intended to be limiting by the embodiments.

One skilled in the art would understand that when the material property of the molding material 1200 is different in different embodiments, the heating curing time of the molding material 1200 within the molding cavity 3600 will be correspondingly changed, and thus the present invention is not intended to be limiting by the embodiments.

It is worth mentioning that the structure of the camera module 100 according to the preferred embodiment of the present invention is exemplary only, the camera module 100 can also have other alternative structure. For example, the camera module 100 is generally manufactured by two kinds of molding process which are MOB process and MOC process. In the MOB process the module supporting frame 12 is only molded on the circuit board 112 of the molded circuit board assembly 10 of the camera module 100. In the MOC process, the module supporting frame 12 is molded on the circuit board 112 and photosensitive element 111 of the molded circuit board assembly 10 of the camera module 100.

Referring to FIG. 20 to FIG. 25 of the drawings, an alternative mode of the camera module 100 of the present invention is illustrated. As the structures of the camera module 100 and the module supporting frame 12 have many different alternative modes, the molding cavity 3600 formed after the pressing of the upper mould 363 and the lower mould 364 can be changed corresponding to the module supporting frame 12, such that the module supporting frame 12 can be molded and has alternative structures in different alternative modes, and thus the different molded circuit board assemblies 10 of the camera module 100 can be manufactured. Alternative modes of the molded circuit board assemblies of the camera modules manufactured by the manufacturing equipment 300 are illustrated as follows.

Figure 20:
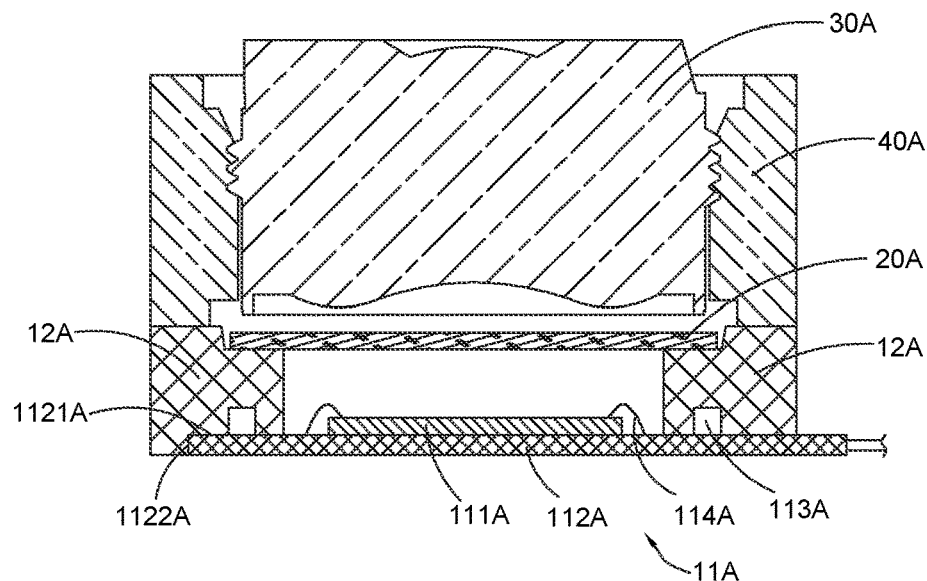
FIG. 20 to FIG. 25 illustrates alternative modes of the camera module according to the above preferred embodiment of the present invention.

As shown in FIG. 20 of the drawings, a camera module 100A by the MOB process is illustrated. The camera module 100A comprises a molded circuit board assembly 10A, an optical filter 20A, a lens 30A and a motor 40A. One skilled in the art would understand that, in other embodiments such as in fixed focus (FF) camera modules, no motor 40A is provided, and that the present invention is not intended to be limiting by the embodiments. In this embodiment, the camera module 100A is embodied as an auto focus camera module. The molded circuit board assembly 10A comprises a substrate board 11A and a module supporting frame 12A. The substrate board 11A further comprises a circuit board 112A, a plurality of integrated circuit electronic components 113A (such as resistors, capacitors, and other elements, hereafter called IC) and a plurality of leading wires 114A. The leading wires 114A electrically conduct the photosensitive element 111A with the circuit board 112A. It is understandable that the photosensitive element 111A and the circuit board 112A also may have other conductive ways in other embodiments. The leading wires 114A are embodied as gold threads in this embodiment. The module supporting frame 12A supports the optical filter 20A. The module supporting frame 12A may further have electrical properties. For example, the module supporting frame may be electrically engraved to electrically conduct the motor 40A with the substrate board 11A, so that it is able to replace the conventional motor bonding wires and can simplify the conventional manufacturing process. Certainly, the motor 40A and the circuit board 112A can also be conducted by the conventional motor bonding wires. In this embodiment, the module supporting frame 12A is molded on the circuit board 112A without contacting the photosensitive element 111A and the leading wires 114A. It is worth mentioning that the module supporting frame 12A is not only molded on a top surface 1121A of the circuit board 112A, but also the module supporting frame 12A can be molded and coated on at least one side surface 1122A of the circuit board 112A. It is understandable that the module supporting frame 12A can also integrally be molded on the integrated circuit electronic components 113A.

Figure 21:
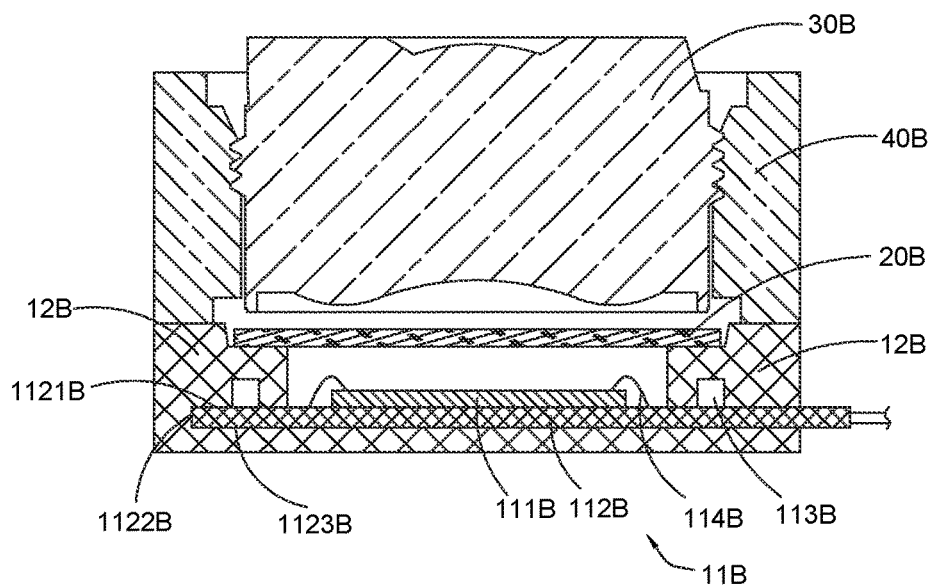

As shown in FIG. 21 of the drawings, another alternative mode of the camera module 100 is illustrated. A camera module 100B is also manufactured by the MOB process in order to be assembled and to be positioned after the molding process and in order to improve the flatness. The camera module 100B comprises a molded circuit board assembly 10B, an optical filter 20B, a lens 30B, and a motor 40B. Similarly, taking the auto focus type camera module as an example, the motor 40B is disclosed. However, in other embodiments of fixed focus type camera modules, the motor 40B may not be needed, and that the present invention is not intended to be limiting by the embodiments.

Specifically, the molded circuit board assembly 10B comprises a substrate board 11B and a module supporting frame 12B. The substrate board 11B further comprises a circuit board 112B, a plurality of integrated circuit electronic components 113B and a plurality of leading wires 114B. The module supporting frame 12B supports the optical filter 20B. Compared with the embodiment as shown in FIG. 21 of the drawings, the module supporting frame 12B is not only molded on the circuit board 112B and the integrated circuit electronic components 113B and coated a top surface 1121B and at least one side surface 1122B of the circuit board 112B, but also the module supporting frame 12B is molded and coated on a bottom surface 1123B of the circuit board 112B, so that overall the camera module 100B has a flat side surface and a flat bottom surface and is easy to be installed and positioned on other components. In order to mold the bottom surface 1123B, the lower mould 364B may be provided with a groove matched with the bottom surface 1123B and a bulge fixing the substrate board 11B, so that when the 363B and the 364B are in the closed-mould state, the 1200B can be fulfilled and coat the top surface 1121B and at least one side surface 1122B of the circuit board 112B, so that the side surface and/or the bottom surface of the circuit board 112B is coated and the module supporting frame 12B is integrally molded.

As shown in FIG. 20 and FIG. 21 of the drawings, the camera module 100A and the camera module 100B by the MOB process are illustrated. The following alternative modes of the camera module 100 are manufactured by the MOC process.

Figure 22:
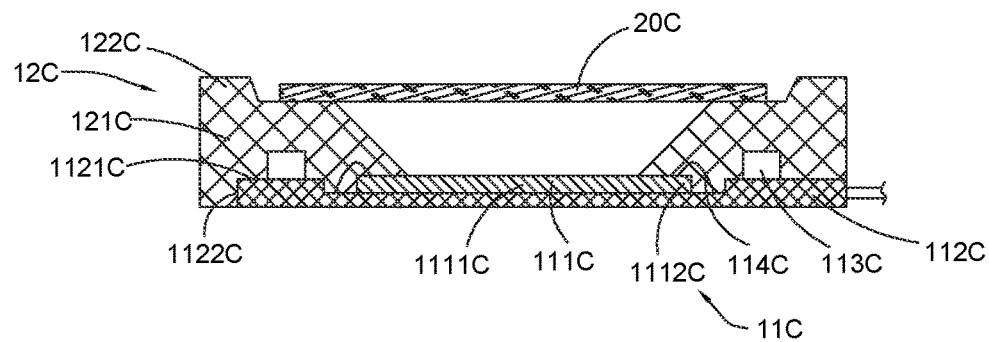

As shown in FIG. 22, another embodiment of the camera module 100 is illustrated. A camera module 100C comprises a molded circuit board assembly 10C, an optical filter 20C and a lens 30C. The molded circuit board assembly 10C comprises a substrate board 11C and a module supporting frame 12C having a light window 121C. The substrate boards 11C further comprises a photosensitive element 111C, a circuit board 112C, a plurality of integrated circuit electronic components 113C and a plurality of leading wires 114C. The module supporting frame 12C supports the optical filter 20C and is directly molded on the circuit board 112C and the photosensitive element 111C without contacting the photosensitive area of the photosensitive element 111C which can be a photosensitive chip. In other words, the embodiment of the present invention adopts the MOC process. It is worth mentioning that the photosensitive element 111C comprises a photosensitive area 1111C and a non-photosensitive area 1112C integrally extended from the photosensitive area 1111C. During the molding process, the module supporting frame 12 does not mold on the photosensitive area 1111C while the module supporting frame 12C is molded on the non-photosensitive area 1112C of the photosensitive element 111C. The non-photosensitive area 1112C is provided with pads connected with the leading wires 114C to electrically conduct the photosensitive element 111C. A side surface of the module supporting frame 12C can be further coated on a side surface 1122C of the circuit board 112C, so that the side surface of the circuit board 112C is not bulged out and exposed after being molded. In addition, a plurality of side surfaces of the circuit board 112C may be molded and coated in other alternative modes. The module supporting frame 12C molds on a bottom portion of the circuit board 112C in other alternative embodiments. It is worth mentioning that as the module supporting frame 12C also molds and embeds the leading wires 114C and the non-photosensitive area 1112C of the photosensitive element 111C, the upper mould 363C also has matched grooves, so that the molding material 1200C is solidified to form the matched module supporting frame 12C.

Figure 23:
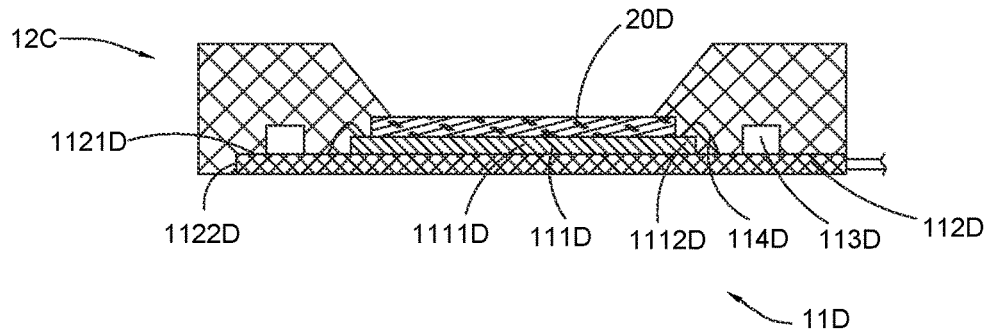

As shown in FIG. 23 of the drawings, another alternative mode of the camera module 100 is illustrated. Compared with the camera module 100C, a camera module 100D in this embodiment has a similar structure. It is different from that an optical filter 20D of the camera module 100D is placed on a photosensitive element 111D and the module supporting frame 12D having a light window 121D is molded on the optical filter 20D and the photosensitive element 111D, thereby reducing damages of the photosensitive element 111D during molding and using and reducing a back focal length of the lens, and thus the camera module 100D is overall thinner.

Figure 24:
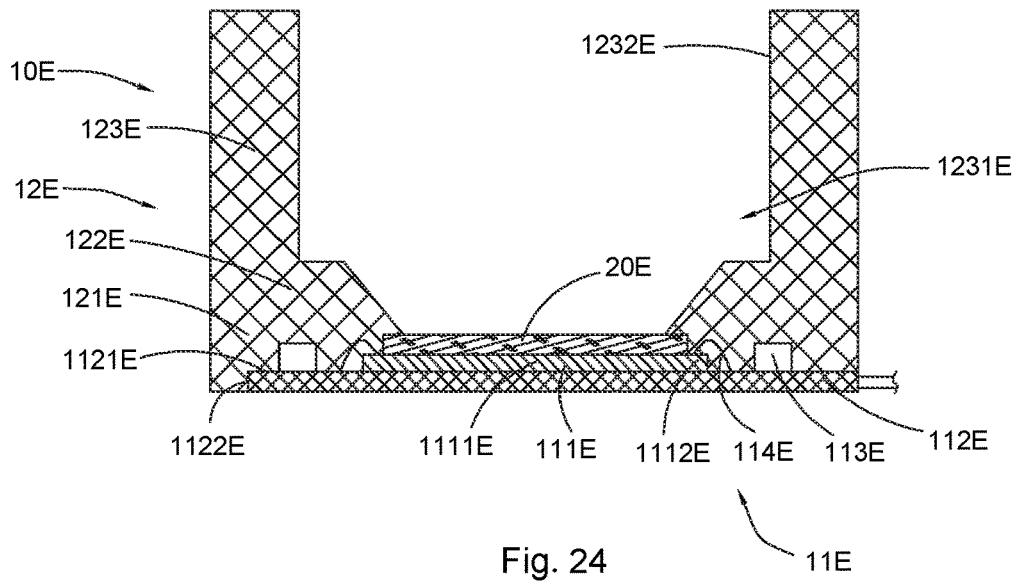

It is worth mentioning that during the MOB or MOC process to produce the module supporting frame 12D by the molding unit 360 of the manufacturing equipment 300, as the photosensitive element 111D is thin and fragile, a protection mechanism for the photosensitive element 111D is required for protecting the photosensitive from being crashed because of bearing too much load. Moreover, since the leading wire 114D is provided and crookedly extended between the circuit board 112D and the photosensitive element 111D for electrically connecting the circuit board 112D with the photosensitive element 111D, space should be further reserved for the leading wire 114D when designing the protection mechanism for the photosensitive element 111D so as to prevent the leading wire 114D from being deformed by pressure or even detached from the photosensitive element 111D and the circuit board 111D. Accordingly, the structure of molding unit should be modified, especially the upper mould 363 D and the lower mould 364D in order to effectively eliminate the concerns mentioned above. As shown in FIG. 24 of the drawings, another alternative mode of the camera module 100 is illustrated. The mainly difference is a module supporting frame 12E of the camera module 100E. A top portion of the module supporting frame 12E is extended upwardly to form a supporting wall 122E. The supporting wall 121E forms a receiving groove 123E for receiving the lens. In other words, the module supporting frame 12E is capable of supporting the lens directly so as to obtain a high-precision fixed focus (FF) type camera module.

Figure 25:
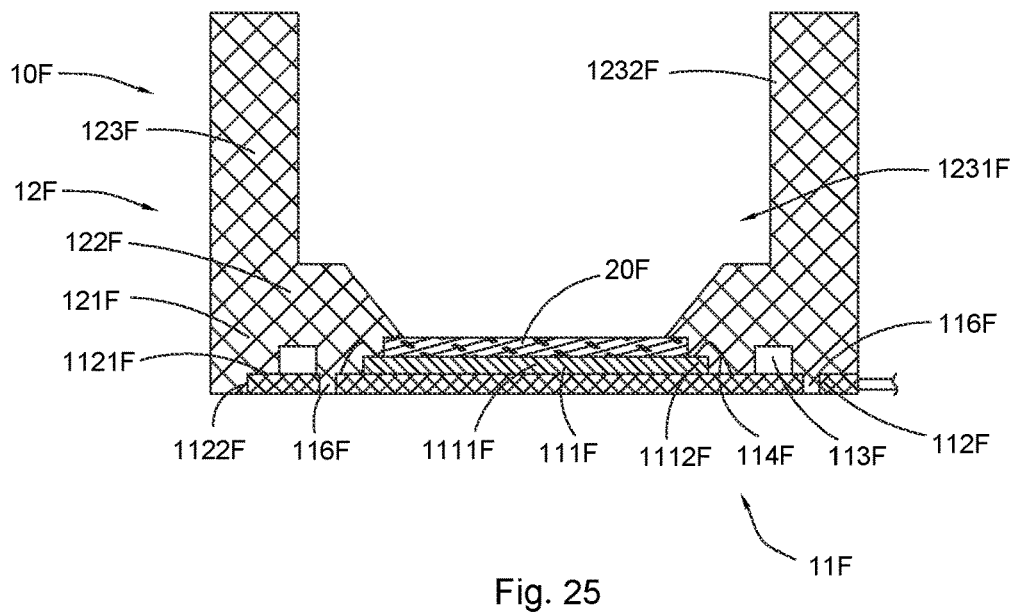
Figure 26:
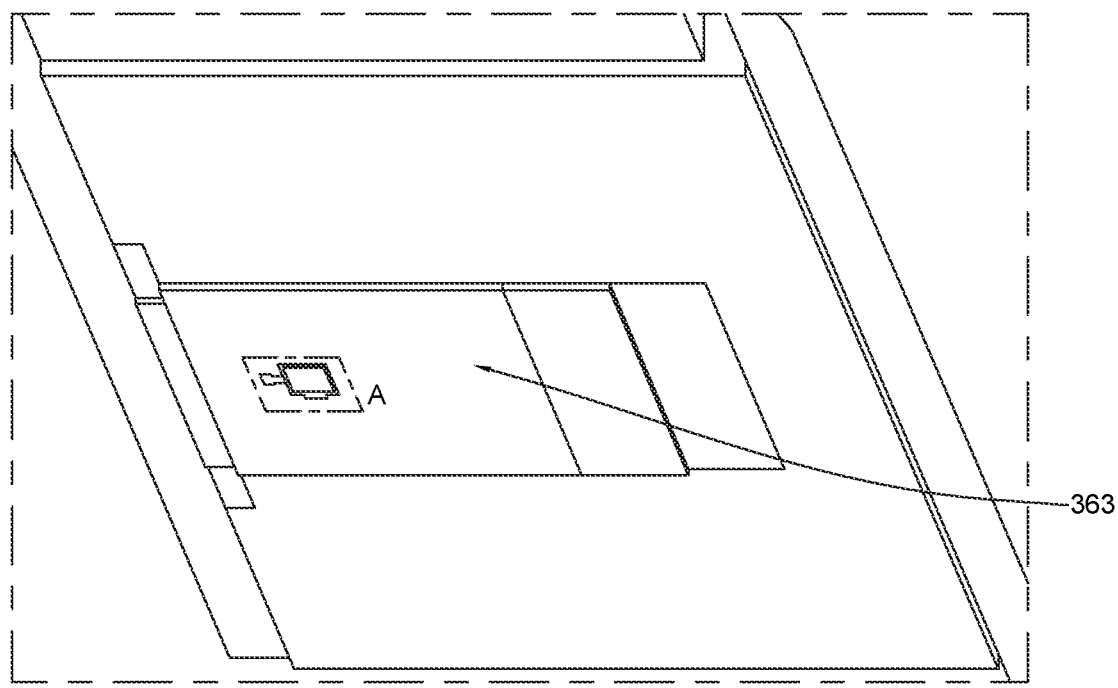
FIG. 26 is a perspective view of the upper mould of the manufacturing equipment for the molded circuit board assembly of the camera module according to the above preferred embodiment of the present invention.
Figure 27:
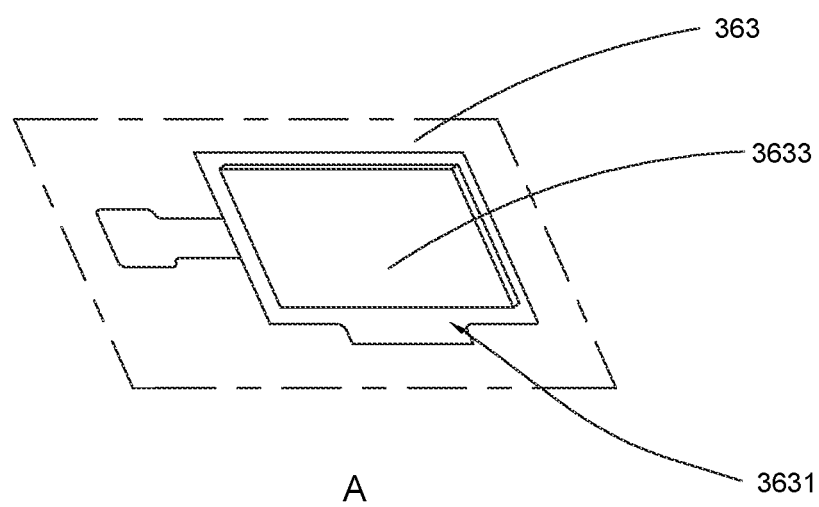
FIG. 27 is a partial enlarged schematic view of the upper mould of the manufacturing equipment for the molded circuit board assembly of the camera module according to the above preferred embodiment of the present invention.
Figure 28:
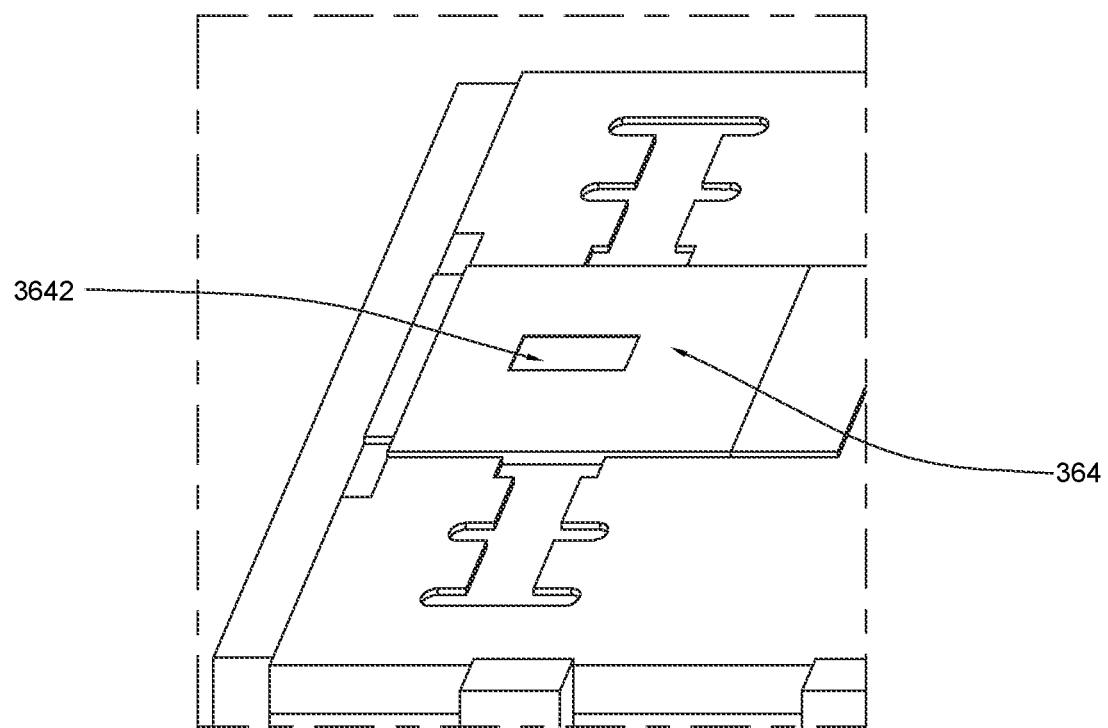
FIG. 28 is a perspective view of the lower mould of the manufacturing equipment for the molded circuit board assembly of the camera module according to the above preferred embodiment of the present invention.
Figure 29:
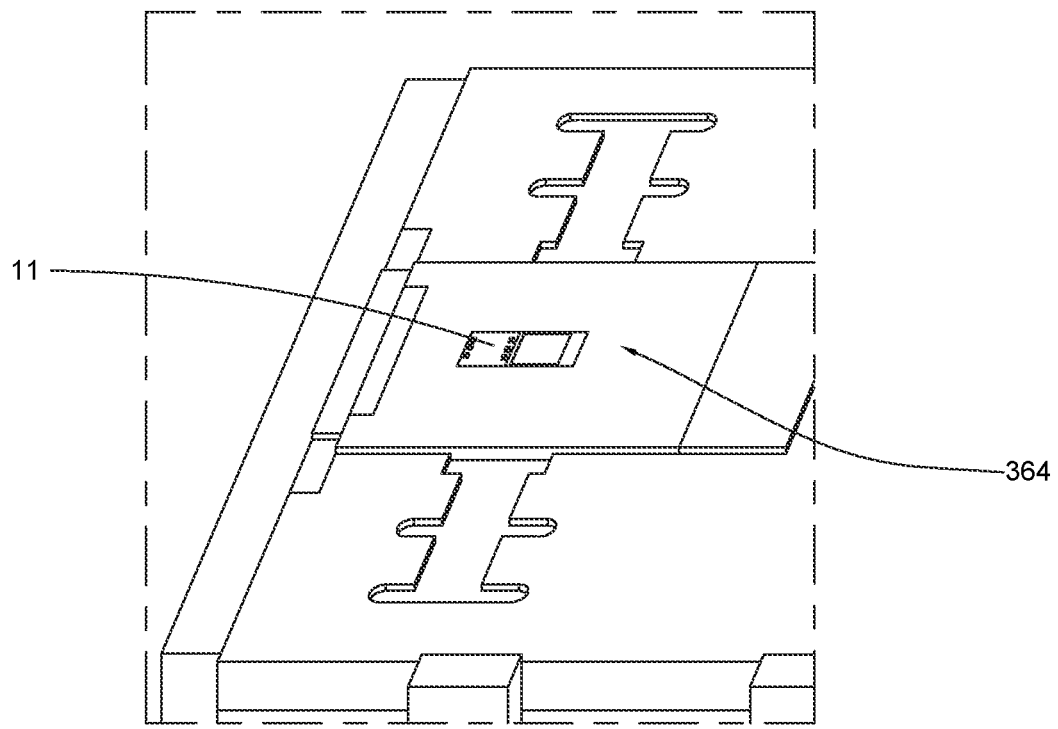
FIG. 29 is a perspective view of the lower mould of the manufacturing equipment for the molded circuit board assembly of the camera module according to the above preferred embodiment of the present invention, illustrating that the single molded circuit board assembly is formed.
Figure 30:
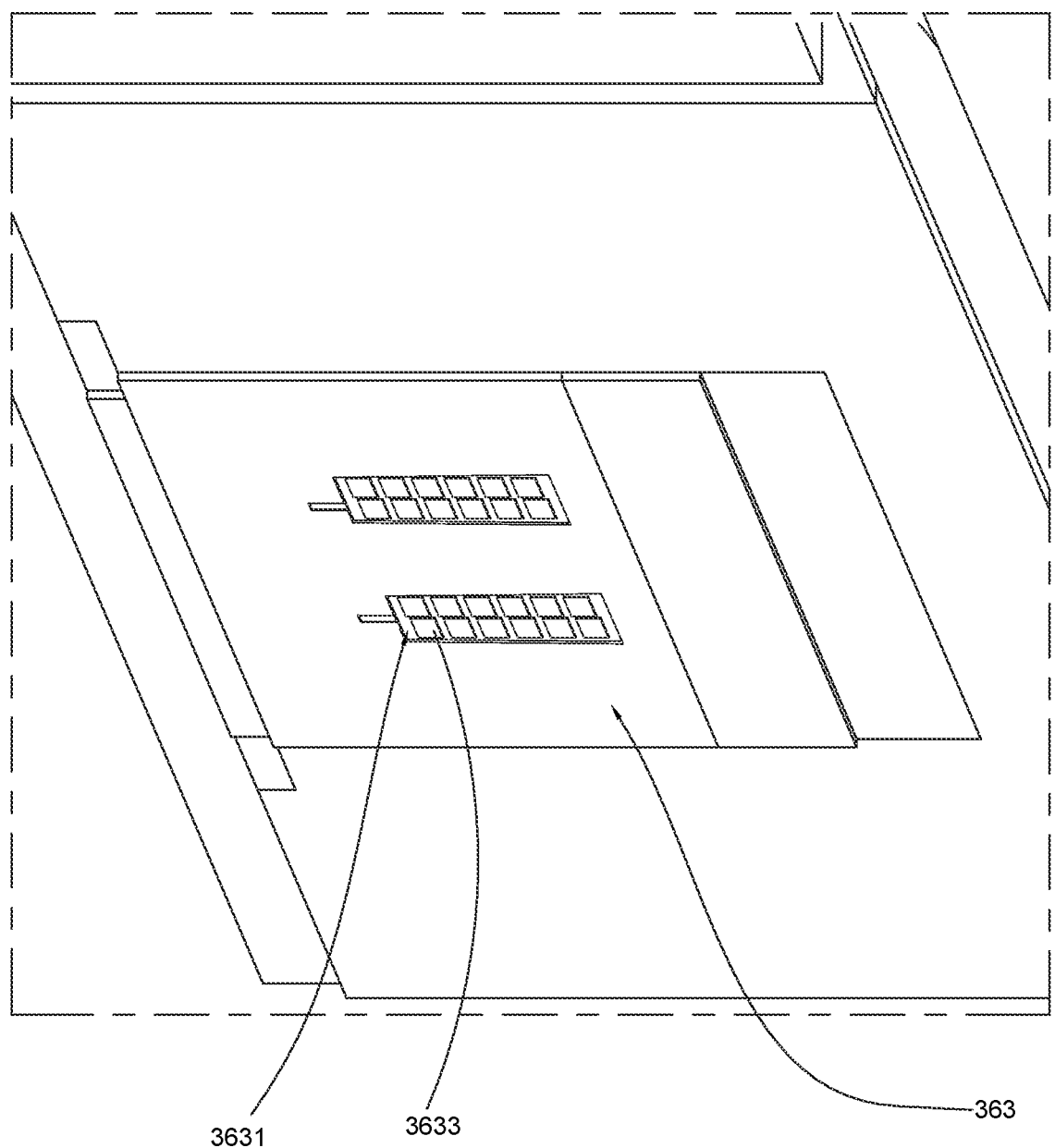
FIG. 30 is a partial enlarged schematic view of the upper mould of the manufacturing equipment for the molded circuit board assembly of the camera module according to the above preferred embodiment of the present invention.
Figure 31:
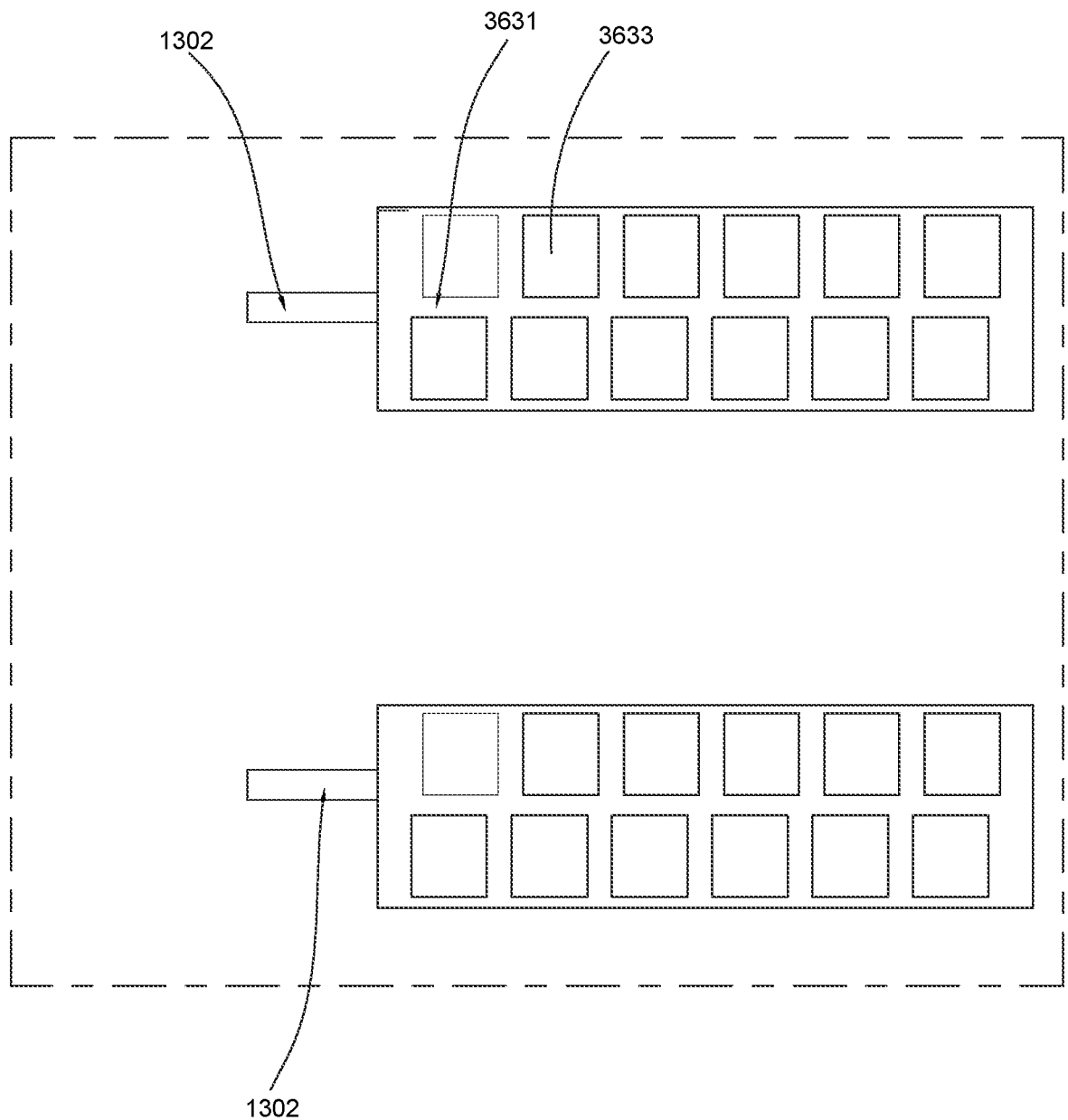
FIG. 31 is a partial enlarged schematic view of the upper mould of the manufacturing equipment for the molded circuit board assembly of the camera module according to the above preferred embodiment of the present invention.
Figure 32:
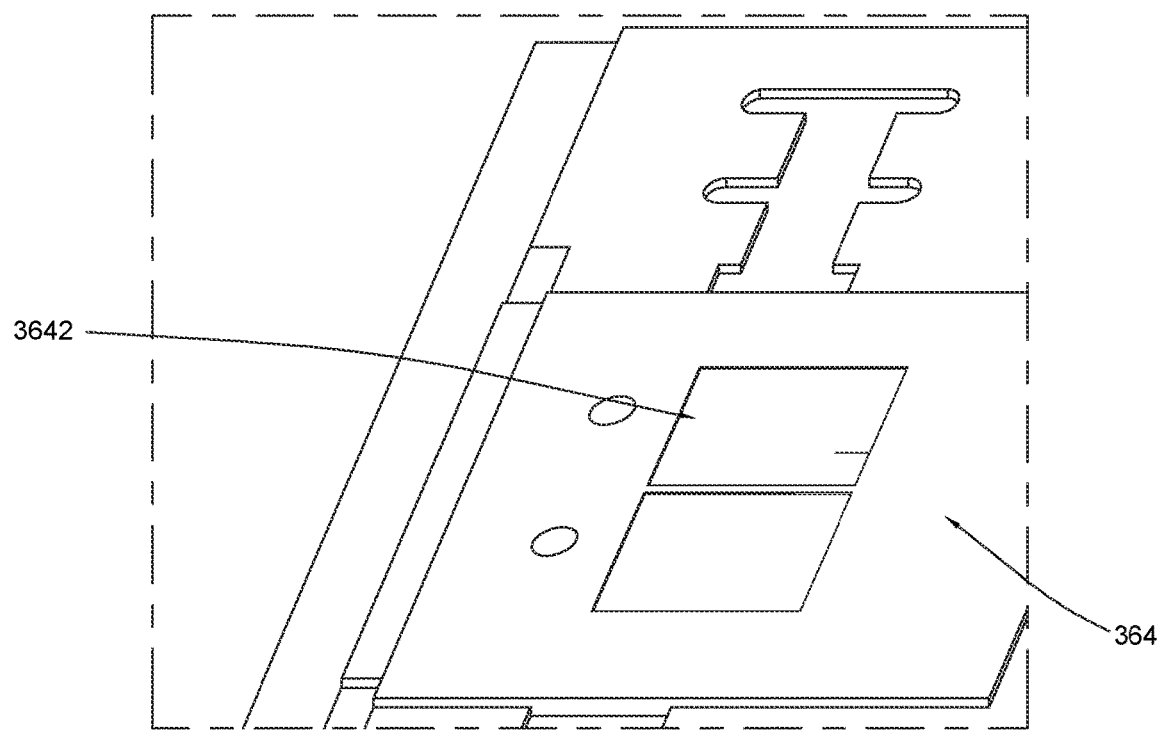
FIG. 32 is a perspective view of the lower mould of the manufacturing equipment for the molded circuit board assembly of the camera module according to the above preferred embodiment of the present invention.
Figure 33:
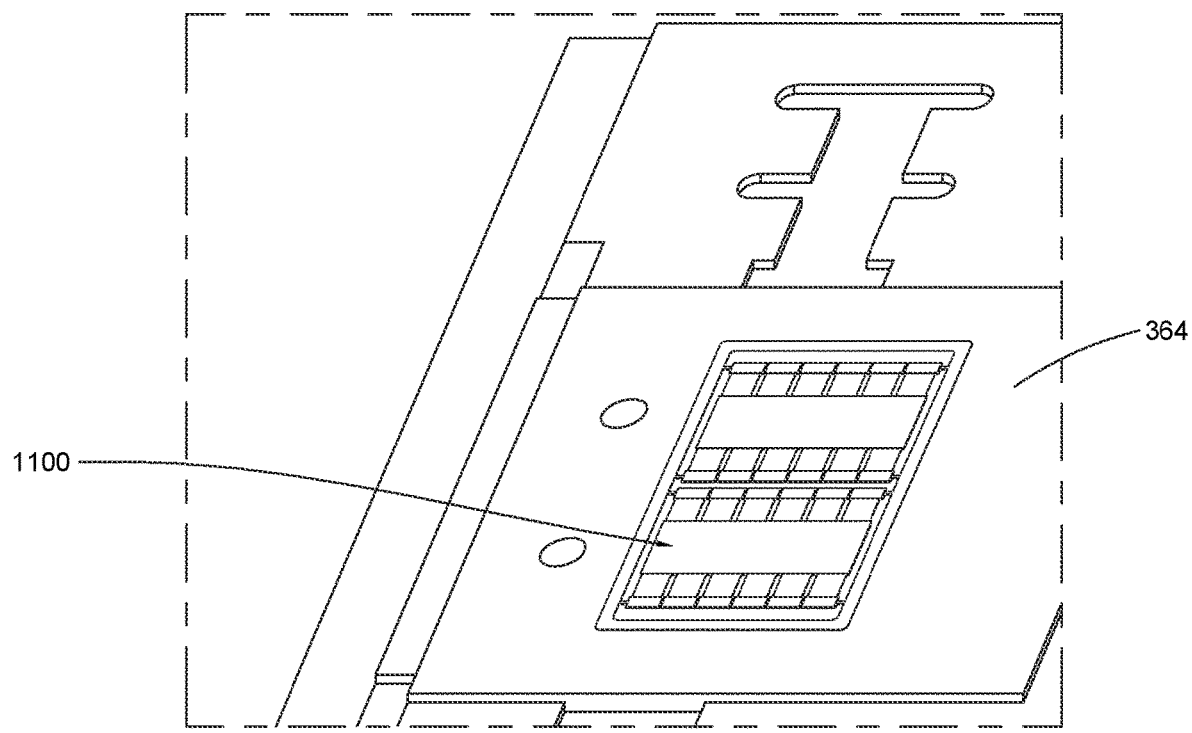
FIG. 33 is a perspective view of the lower mould of the manufacturing equipment for the molded circuit board assembly of the camera module according to the above preferred embodiment of the present invention, illustrating that the molded circuit board assembly combination is formed.

As shown in FIG. 25 of the drawings, another alternative mode of the camera module 100 is illustrated. A circuit board 111F is provided with one or more through-holes 116F. A material forming the module supporting frame 12F enters the through-holes 116F and is fulfilled into the through-holes 116F, so that a reinforce effect of the circuit board 111F is enhanced. Similarly, the module supporting frame 12F is not only coated on a top surface of the 111F, but also is coated on a side surface and a bottom surface of the circuit board 111F. It is understandable that the through-holes 116F of the circuit board 111F can be applied on other embodiments of the present invention.

In a word, the above camera modules from the camera module 100A to the camera module 100F are alternative modes of the camera module 100. The molding cavity 3600 formed when the upper mould 363 and the lower mould 364 in the closed-mould state has a matched shape with the shape of the corresponding module support. In other words, when the upper mould 363 and the lower mould 364 are in the closed-mould state, the molding cavity 3600 is formed between the upper molding surface which is formed by the grooves and protrusions of the upper mould 363 and the lower molding surface which is formed by the grooves and protrusions of the lower mould 364, and the molding cavity 3600 may be changed and replaced. The grooves and protrusions of the upper mould 363 and the lower mould 364 can be changed and matched with the molded circuit board assemblies of different types of camera modules, so that the manufacturing equipment for molded circuit board assembly of camera module 300 is capable of manufacturing the molded circuit board assemblies of different types of camera modules. One skilled in the art would understand that the above camera module 100 and alternatives modes of the camera module 100 are exemplary only and not intended to be limiting.

It is worth mentioning that after the module supporting frame 12 is integrally molded, there can be a surface treatment process for the module supporting frame 12 such as a film coating process, thereby increasing the hardness of the module supporting frame 12 and preventing being scratched and corrosion. In addition, it is convenient to demould.

Referring to FIG. 37 to FIG. 44 of the drawings, an alternative mode of the molding unit 9100 according to another preferred embodiment of the present invention is illustrated, wherein the molding unit 9100 is configured for manufacturing a molded circuit board assembly 920. As shown in the FIG. 37 to FIG. 44 of the drawings, the molded circuit board assembly 920 comprises an imaging assembly 921 and a molded base 923, wherein the molded base 923 is integrally formed on the imaging assembly 921 in the molding unit 9100, such that the molded base 923 is able to take place of a lens holder or a module supporting frame of the conventional camera module and therefore the procedures of attaching the lens holder or module supporting frame to the circuit board via glue can be eliminated.

The imaging assembly 921 further comprises a photosensitive element 9211 and a circuit board 9212, wherein the photosensitive element 9211 is electrically coupled with the circuit board 9212. The molded base 923 further comprises a ring-shaped molded body 9231 and a light window 9232 defined by the ring-shaped molded body 9231, wherein the ring-shaped molded body 9231 is integrally formed on the circuit board 9212, and the light window 9232 is in the optical path of the photosensitive element 9211, such that the imaging light from outside can be sensed by the photosensitive element through the light window 9232 of the molded base 923.

Furthermore, the circuit board 9212 has a chip-mounting area 92121 and a peripheral area 92122 integrally and outwardly extended from the chip-mounting area 92121, wherein the chip-mounting area 92121 is surrounded by the peripheral area 92122 and more particularly is located at a mid-portion of the peripheral area 92122. Accordingly, the photosensitive element 9211 is attached to the circuit board 9212 at the chip-mounting area 92121 thereof. The circuit board 9212 further comprises a set of circuit-board connecting members 92123 provided at the peripheral area 92122 adjacent to the chip-mounting area 92121 of the circuit board 9212 for electrically conducting the circuit board 9212 to the photosensitive element 9211.

Accordingly, the photosensitive element 9211 comprises a photosensitive region 92111 and a non-photosensitive region 92112, wherein the photosensitive region 92111 and the non-photosensitive region 92112 are integrally formed at a top surface of the photosensitive element 9211. The photosensitive region 92111 is surrounded by the non-photosensitive region 92112 and more specifically is located at a mid-portion of the non-photosensitive region 92112. The photosensitive element 9211 further comprises a set of chip-connecting members 92113 located at the photosensitive region 92111 for electrically connecting with the circuit-board connecting members 92123 of the circuit board 9212 so as to electrically conduct the circuit board 9212 with the photosensitive element 9211.

The imaging assembly 921 further comprises a set of leading wires 9214, wherein each of the leading wires 9214 is crookedly extended between the circuit board 9212 and the photosensitive element 9211 so as to electrically connect the photosensitive element 9211 with the circuit board 9212. More specifically, each of the leading wires 9214 has a circuit-board connecting end 92141 and a chip connecting end 92142 opposed to the circuit-board connecting end 92141, wherein the circuit-board connecting ends 92141 are electrically connected to the circuit board 9212 at the circuit-board connecting members 92123 thereof respectively and the chip connecting ends 92142 are electrically connected to the photosensitive element 9211 at the chip-connecting members 92113 thereof respectively, such that the photosensitive element 9211 is electrically conducted with the circuit board 9212. It is worth pointing out that since each of the leading wires 9214 is upwardly and protrudedly extended between the photosensitive element 9211 and the circuit board 9212, a wiring space 93021 should be provided for each of the leading wires 9214, so as to prevent the leading wires 9214 being crushed by the molding unit 9100 or even getting detached from the circuit board 9212 and/or the photosensitive element 9211 during the process of manufacturing the molded circuit board assembly 920 by the molding unit 9100.

Furthermore, the imaging assembly 921 further comprises a plurality of electronic components 9215 assembled on the circuit board 9212 by surface mounting techniques, wherein the electronic components 9215 are coated in the molded base 923 after the molded base 923 is integrally formed in the molding unit 9100. Typically, the electronic components 9215 comprise capacity, resistor, inductor, etc.

Those who skilled in the art would understand that the circuit board 9212 and the photosensitive element 9211 may get electrically conducted with each other by other measures expect for by the leading wires 9214. For instance, the photosensitive element 9211 can be directly attached to a bottom side of the circuit board 9212 by flip chip technique at a position that the chip-connecting members 92113 of the photosensitive element 9211 presses against the circuit-board connecting members 92123 of the circuit board 9212, thereby electrically connecting the circuit board 9212 with the photosensitive element 9211. It is worth mentioning that the circuit board 9212 and the photosensitive element 9211 being electrically conducted by the leading wire is exemplary only for the purpose of illustrating the advantages of the molding unit 9100 in manufacturing the molded circuit board assembly 920. In other words, the molded circuit board assembly 920 can be regarded as a workpiece merely for illustrating the technical advantages of the molding unit 9100 in molding process.

Figure 38:
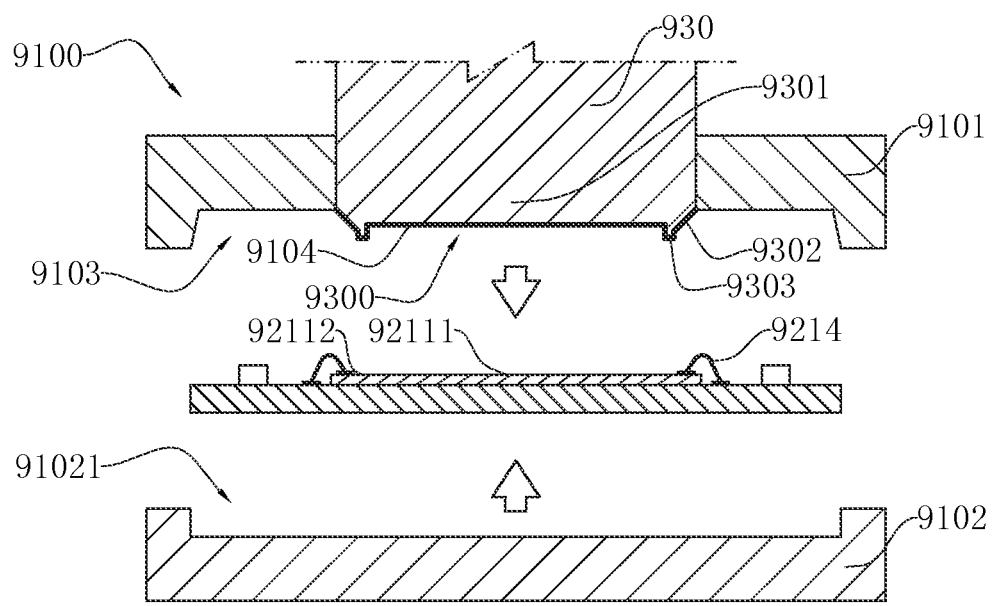
FIG. 38 is a schematic view of the upper mould and the lower mould in an opened-mould state according to the above preferred embodiment of the present invention.
Figure 39:
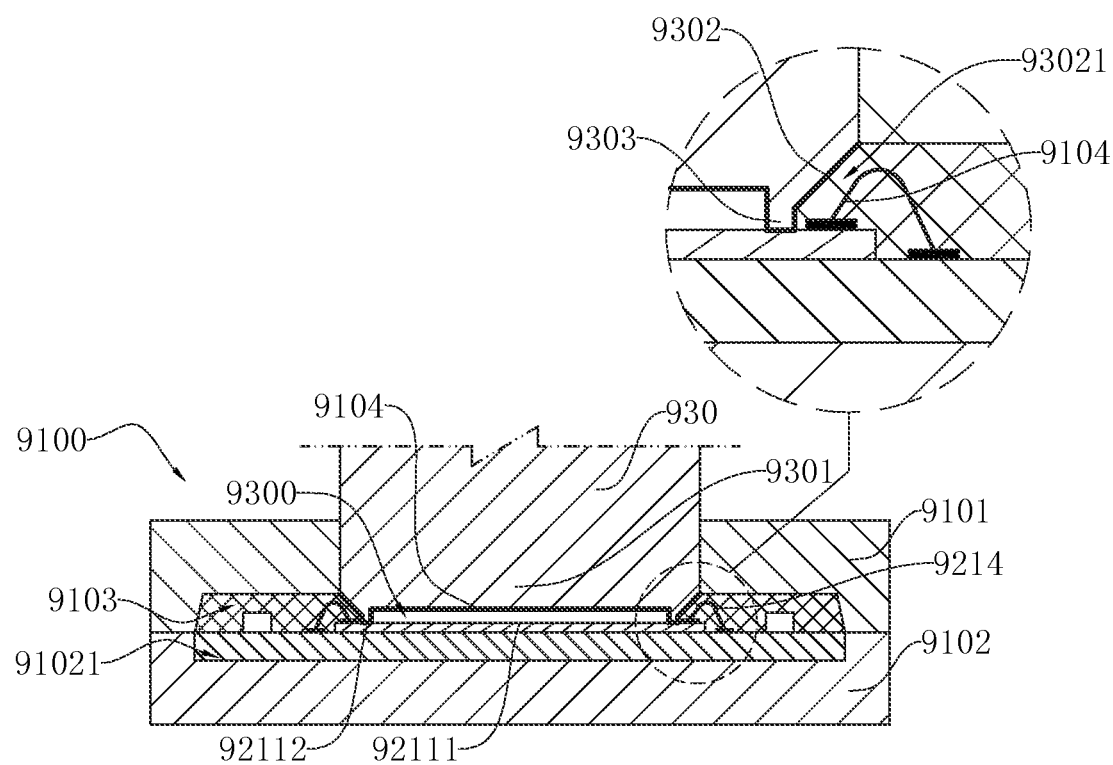
FIG. 39 is a schematic view of the upper mould and the lower mould in a closed-mould state according to the above preferred embodiment of the present invention.
Figure 40:
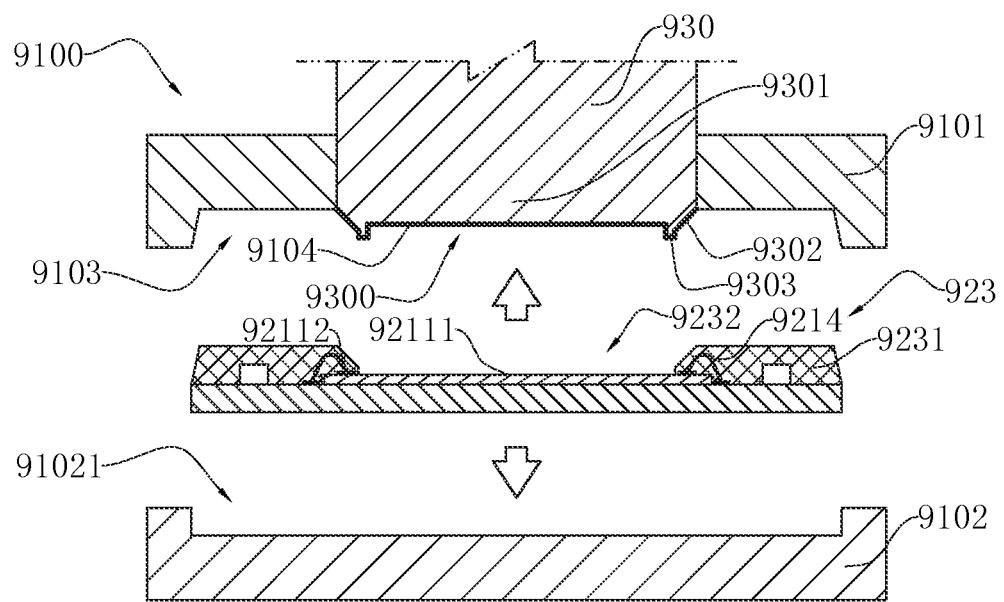
FIG. 40 is a schematic view illustrating that the upper mould and the lower mould are separated with each other according to the above preferred embodiment of the present invention.
Figure 41:
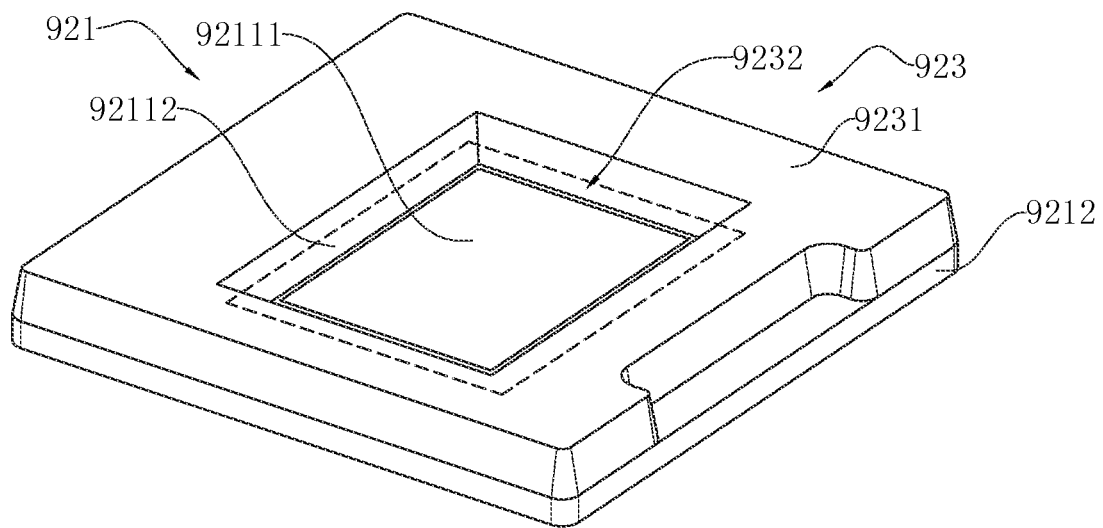
FIG. 41 is a perspective view of the molded circuit board assembly according to the above preferred embodiment of the present invention.

More specifically, as shown in FIG. 38 to FIG. 40 of the drawings, the molding unit 9100 further comprises an upper mould 9101 and a lower mould 9102, wherein a molding cavity 9103 is formed between the upper mould 9101 and the lower mould 9102 when the upper mould 9101 and the lower mould 9102 is in a closed-mould state that the upper mould 9101 is sealedly attached with the lower mould 9102. Accordingly, the imaging assembly 921 is arranged to mount in the molding cavity 9103, wherein the molded base 923 is integrally formed on the circuit board 9212 of the imaging assembly 921 after the molding material being fulfilled in the molding cavity 9103 is solidified by thermal curing. In particular, at least a portion of the circuit board 9212 and the photosensitive element 9211 is coated by the molded base 923.

Furthermore, the molding unit 9100 further comprises a separating element 930 extending in the molding cavity 9103 formed by the upper mould 9101 and the lower mould 9102 in the closed-mould state. Accordingly, when the imaging assembly 921 is supported in the molding cavity 9103, the separating element 930 is overlappedly attached to an upper side of the photosensitive element 9211 of the imaging assembly 921 to seal the photosensitive element 9211 thereby, such that the molding material being filled into the molding cavity 9103 is unable to enter into the photosensitive element 9211. In this way, the molding material forms the ring-shaped molded base 923 around the separating element 930 while forming the light window 9232 at a position corresponding to the separating element 930.

More specifically, in case that the separating element 930 is provided in the upper mould 9101 and the imaging assembly 921 is mounted in the lower mould 9102. The separating element 930 provided in the upper mould 9101 is gradually getting close to the photosensitive element 9211 of the imaging assembly 921 in the lower mould 9102 and finally overlaps on the photosensitive element 9211 in order to prevent the molding material flowing into the photosensitive element 9211 during the process of molding the molded base 923 in the molding cavity 9103. When the upper mould 9101 and the lower mould 9102 are getting close to each other to form the molding cavity 9103. Alternatively, the separating element 930 may be mounted in the lower mould 9102 of the molding unit 9100. In this case, the imaging assembly 921 is mounted in the upper mould 9101 upside down, and when the upper mould 9101 and the lower mould 9102 are in the closed-mould state, the separating element 930 mounted in the lower mould 9102 is overlapped on an upper side of the photosensitive element 9211 for sealing the photosensitive element 9211 by the separating element 930. In other words, the position of the separating element 930 is not intended to be limiting in this preferred embodiment.

More detailedly, when the upper mould 9101 and the lower mould 9102 are in the closed-mould state, the separating element 930 is overlapped on the photosensitive element 9211 to seal at least the photosensitive region 92111 of the photosensitive element 9211, such that the molding material being filled into the molding cavity 9103 is blocked from entering into the photosensitive region 92111 of the photosensitive element 9211 so as to form the molded base 923 outside the photosensitive region 92111 of the photosensitive element 9211 while forming the light window 9232 at the position corresponding to the separating element 930. In particular, the separating element 930 is provided at an inner side of the chip-connecting members 92113 of the photosensitive element 9211 and during the molding process, the separating element 930 is sealedly overlapped with the photosensitive element 9211 in the area at the inner side of the chip-connecting members 92113. In this way, the circuit board 9212 and the photosensitive element 9211 are coated in the molded base 923 to form the molded circuit board assembly 920 with integral structure after the molded base 923 is integrally formed in the molding cavity 9103.

As shown in FIG. 42, the separating element 930 further comprises a main separating body 9301 and an inclined side portion 9302 integrally formed at a side portion of the main separating body 9301, wherein when the separating element 930 is overlappedly attached to photosensitive element 9211 at the inner side of the chip connecting members 92113 thereof, the main separating body 9301 is overlappedly attached to the photosensitive region 92111 of the photosensitive element 9211 and the inclined side portion 9302 is spacedly extended over the leading wires 9214 which electrically connect the circuit board 9212 with the photosensitive element 9211 for preventing separating element 930 being contacted with the leading wires 9214. As mentioned above, the leading wires 9214 are crookedly extended between the circuit-board connecting members 92123 of the circuit board 9212 and the chip-connecting members 92113 of the photosensitive element 9211, such that when the separating element 930 is overlappedly attached on the photosensitive element 9211, enough wiring space 93021 should be provided for the leading wires 9214 to prevent the leading wires 9214 from being crushed by the separating element 930 or even detached from the circuit board 9212 and the photosensitive element 9211. Accordingly, when the separating element 930 is overlappedly attached on the photosensitive element 9211, the inclined side portion 9302 extending spacedly over the leading wires 9214 provides such wiring space 93021 for the leading wires 9214, and each of the leading wires 9214 is crookedly and outwardly extended from the wiring space 93021 to the photosensitive element 9211 without being in contact with the separating element 930.

It is worth mentioning that during the molding process, the molding material being filled in the molding cavity 9103 would flow into the wiring space 93021, such that after the molding material is thermally cured to form the molded base 923, the leading wires 9214 are embedded in the molded base 923. In other words, the shape of the wiring space 93021 formed by the separating element 930 and intended for the leading wires 9214 should be designed in accordance with the curvature of the leading wires 9214, such that the leading wires 9214 can be more fittedly packaged in the molded base 923 to form a more stable integral structure, as is to be discussed below.

The separating element 930 further comprises an extension portion 9303 integrally formed at a bottom side of the main separating body 9301, wherein when the separating element 930 is overlappedly attached on the photosensitive element 9211, the extension portion 9303 is sealedly overlapped with the photosensitive element 9211 to seal at least the photosensitive region 92111 of the photosensitive element 9211. In this preferred embodiment, the extension portion 9303 is downwardly extended from the bottom side of the main separating body 9301, which creates many advantages for the separating element 930.

Accordingly, without the extension portion 9303, the transition angle between the inclined side portion 9302 and the main separating body 9301 at the bottom of the separating element 930 would be much larger, so that the molding material being filled in the molding cavity 9103 is more easily and more likely flow into the photosensitive element 9211 from the transition portion between the inclined side portion 9302 and the main separating body 9301 at the bottom of the separating element 930, which would cause trimming around the photosensitive element 9211. In contrast, equipped the extension portion 9303 which is downwardly extended from the bottom side of the main separating body 9301, the transition angle between the inclined side portion 9302 and the main separating body 9301 at the bottom of the separating element 930 would be decreased effectively, such that the separating element 930 can be more tightly attached to the photosensitive element 9211 to effectively seal the photosensitive element 9211 during the molding process, thereby preventing the molding material flowing into the photosensitive element 9211 to cause a process error such as the trimming.

In addition, the extension portion 9303 downwardly extended from the bottom side of the main separating body 9301 has a certain height, such that when the separating element 930 is overlappedly attached on the photosensitive element 9211, the distance between the inclined side portion 9302 and the photosensitive element 9211 is increased, so as to enlarge the wiring space 93021 for allowing the leading wires 9214 to wind in the wiring space 93021 freely. In other words, with the extension portion 9303, the wiring space 93021 is defined by the extension portion 9303 and inclined side portion 9302 together, more specifically at an outer side of the extension portion 9303 and main separating body 9301. Compared with the situation that the wiring space 93021 is merely defined by the inclined side portion 9302, the wiring space 93021 defined by the extension portion 9303 and inclined side portion 9302 is larger especially in the height dimension, such that unnecessary contacts between the separating element 930 and the leading wires 9214 can be effectively prevented.

More detailedly, when the separating element 930 is attached on the photosensitive element 9211 at a position that the bottom peripheral edge of the separating element 930 is adjacent to the chip-connecting members 92113 of the photosensitive element 9211, the protrusion portion of the leading wires 9214 at the chip-connecting members 92113 of the photosensitive element 9211 is highly susceptible to contact with the separating element 930. In order to prevent this unwanted contact, the slope of the inclined side portion 9302 of the separating element 930 should be greatly increased. However, the wiring space 93021 defined by inclined side portion 9302 with too large slope is not conducive to the subsequent molding process. Because of the extension portion 9303, unwanted extrusion between the separating element 930 and the leading wires 9214 can be eliminated effectively without significantly modifying the inclination of the inclined side portion 9302 of the separating element 930. Moreover, since the wiring space 93021 is defined by the extension portion 9303 and inclined side portion 9302, it becomes more convenient to modify the shape and size of the wiring space 93021. In particular, the shape of the wiring space 93021 can be modified substantially matching with the curvature of the leading wires 9214, so that the molded base 923 integrally formed in the molding cavity 9103 can be more fitted with the leading wires 9214.

Accordingly, in this preferred embodiment, the extension portion 9303 is vertically extended from the bottom side of the main separating body 9301, such that when the separating element 930 is overlapped on the photosensitive element 9211, the extension portion 9303 is perpendicular to the photosensitive element 9211. In this way, the transition angle between the inclined side portion 9302 and the main separating body 9301 at the bottom of the separating element 930 can be increased, so as to seal the photosensitive element 9211 more tightly to prevent any process error such as trimming.

Figure 42A:
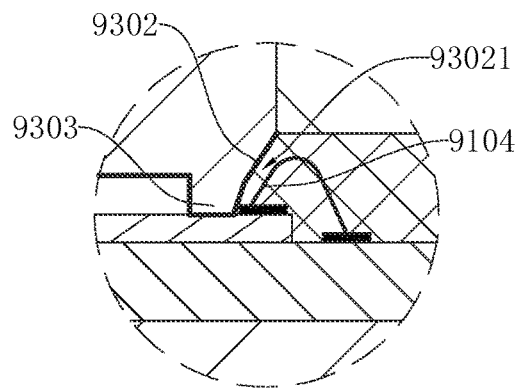
FIG. 42A is an alternative mode of the upper mould and lower mould according to the above preferred embodiment of the present invention.

Referring to FIG. 42A of the drawings, an alternative mode of the extension portion 9303 is illustrated, wherein the extension portion 9303 is downwardly and inwardly extended from the main separating body 9301. The inclination of the extension portion 9303 can be modified freely in accordance with the extending manner of the leading wires 9214, such that the molded base 923 integrally formed in the molding cavity 9103 can be more fittedly package the leading wires 9214 therein. It is appreciated that the inclination of the inclined side portion 9302 of the separating element 930 can be modified freely as well, so as to incorporate with the extension portion 9303 to adjust the shape and size of the wiring space 93021 in accordance with the curvature of the leading wires 9214.

Figure 42B:
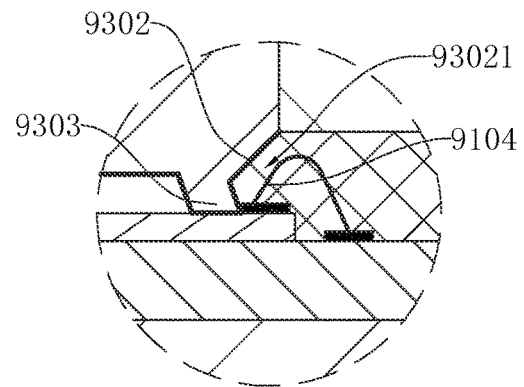
FIG. 42B is an alternative mode of the upper mould and lower mould according to the above preferred embodiment of the present invention.

Referring to FIG. 42B of the drawings, another alternative mode of the extension portion 9303 is illustrated, wherein the extension portion 9303 is downwardly and outwardly extended from the main separating body 9301. Similarly, the inclination of the extension portion 9303 can be modified freely, such that when the separating element 930 is overlappedly attached on the photosensitive element 9211, the transition angle between the inclined side portion 9302 and the main separating body 9301 at the bottom of the separating element 930 can be further decreased, so as to seal the photosensitive more tightly. It is worth mentioning that such configuration is suitable for the molding unit 9100 with a buffering membrane 9104, for the reason that the extension portion 9303 which is downwardly and outwardly extended from the main separating body 9301 applies an greater pressure to the buffering membrane 9104 that the buffering membrane 9104 can be more tightly biased against the photosensitive element 9211, thereby sealing the photosensitive element 9211 more tightly, as is to be discussed in the below.

Furthermore, the separating element 930 in this preferred embodiment further has an dodge space 9300 intendedly formed at the bottom of the separating element 930, wherein when the separating element 930 is overlappedly attached on the photosensitive element 9211, the dodge space 9300 is located between the photosensitive element 9211 and the separating element 930 to prevent the separating element 930 from being directly in contact with the photosensitive region 92111 of the photosensitive element 9211 so as to protect the photosensitive region 92111 of the photosensitive element 9211. Preferably, the size of the dodge space 9300 is slightly larger than that of the photosensitive region 92111 of the photosensitive element 9211, such that when the separating element 930 is sealedly attached on the photosensitive element 9211, the dodge space 9300 located above the photosensitive region 92111 of the photosensitive element 9211 can fully receive the photosensitive region 92111 of the photosensitive element 9211 therein, so as to prevent the bottom of the separating element 930 from being directly contacted with the photosensitive region 92111 of the photosensitive element 9211. In this way, the accidents of crushing the photosensitive region 92111 or damaging the pixels of the photosensitive region 92111 during the molding process can be effectively decreased.

Those who skilled in the art would understand that since the dodge space 9300 is intendedly formed at the bottom of the separating element 930, the size of the contact area between the photosensitive element 9211 and the separating element 930 can be greatly reduced, thereby reducing the difficulty of attaching the separating element 930 to the photosensitive element 9211 effectively. More specifically, if there is no such dodge space 9300 formed at the bottom of the separating element 930, the bottom surface of the separating element 930 is embodied as a flat surface. In this case, the flatness of both of the photosensitive element 9211 and the separating element 930 must be guaranteed in order to achieve a precise fit between the photosensitive element 9211 and the separating element 930. In contrast, if the separating element 930 has the dodge space 9300, that is a portion of the bottom surface of the separating element 930 is intended, the contact area between the photosensitive element 9211 and the separating element 930 is greatly reduced and its position is changed to the non-photosensitive element 9211 of the photosensitive element 9211, such that the difficulty of attaching the separating element 930 to the photosensitive element 9211 can be reduced while the tightness between the separating element 930 and the photosensitive element 9211 can be enhanced as well. In this preferred embodiment, the dodge space 9300 is intendedly formed at the extension portion 9303 of the separating element 930 and incorporates with extension portion 9303 to better seal the photosensitive element 9211, so as to facilitate the implementation of molding process.

As shown in FIG. 39 of the drawings, the molding unit 9100 further comprises a buffering membrane 9104 provided between the separating element 930 and the photosensitive element 9211 to enhance the sealing between the separating element 930 and the photosensitive element 9211. Accordingly, the buffering membrane 9104 is able to further prevent the molding material from entering into the photosensitive element 9211 so as to enhance the molding quality of the molding process. More specifically, in the preferred embodiment, the buffering membrane 9104 is attached to the bottom of the separating element 930 to form a buffering layer between the photosensitive element 9211 and the separating element 930, wherein when the separating element 930 is overlapped on the photosensitive element 9211, the load applied on the photosensitive element 9211 can be effectively absorbed by the buffering membrane 9104 so as to protect the photosensitive element 9211. Moreover, the buffering membrane 9104 also facilitates demould of the upper mould 9101 and the lower mould 9102 after the molding process is completed to form the molded circuit board assembly 920 is formed in the molding cavity 9103.

More specifically, in this preferred embodiment, the buffering membrane 9104 is provided on a molding surface of the upper mould 9101 (bottom surface of the upper mould 9101) and covering the entire extension portion 9303 and the inclined side portion 9302, such that when the separating element 930 is attached on the photosensitive element 9211, the buffering membrane 9104 is tightly attached to the photosensitive element 9211 to enhance the sealing effect between the separating element 930 and the photosensitive element 9211. It is appreciated that, since the buffering membrane 9104 is typically made of flexible material, the buffering membrane 9104 is pressed and deformed by the extension portion 9303 of the separating element 930 when the buffering membrane 9104 is in contact with the photosensitive element 9211, thereby biasing the buffering membrane 9104 to the photosensitive member more tightly so as to further improve the sealing effect of the photosensitive element 9211. As mentioned above, as the dodge space 9300 is intendedly formed at the bottom of the separating element 930, the contact area between the photosensitive element 9211 and the separating element 930 is reduced. Therefore, the pressure acting on the buffering membrane 9104 is increased correspondingly, such that the buffering membrane 9104 is further pushed downward to further reduce the gap between the photosensitive element 9211 and the buffering membrane 9104, thereby enhancing the sealing effect between the photosensitive element 9211 and the separating element 930.

It is worth mentioning that by changing the extending direction of the extension portion 9303, the mechanical effect of the extension portion 9303 acting on the buffering membrane 9104 can be changed correspondingly, so that even if the thickness of the buffering membrane 9104 is relatively large, the gap between the photosensitive element 9211 and the buffering membrane 9104 can be well reduced due to the extending portion, thereby effectively eliminating any process error such as trimming in the molding process.

One skilled in the art would understand that during the molding process, the buffering membrane 9104 should be fixedly attached to the bottom of the separating element 930 and the occurrence of detachment or offset, or etc. shouldn't not appear. Here, the detachment indicates that the buffering membrane 9104 is detached from the bottom surface of the separating element 930 when the separating element 930 is attached to the photosensitive element 9211. In such case, the separating element 930 would directly be in contact with the photosensitive element 9211, and the photosensitive element 9211 may easily be crushed or scratched by the separating element 930. The offset indicates that the buffering membrane 9104 is movable between the separating element 930 and the photosensitive element 9211. If the buffering membrane 9104 moves between the separating element 930 and the photosensitive element 9211, debris would be generated between the photosensitive element 9211 and the buffering membrane 9104 and the moving buffering membrane 9104 would sweep the dust on the non-photosensitive region 92112 of the photosensitive element 9211 into the photosensitive region 92111 of the photosensitive element 9211.

Figure 43:
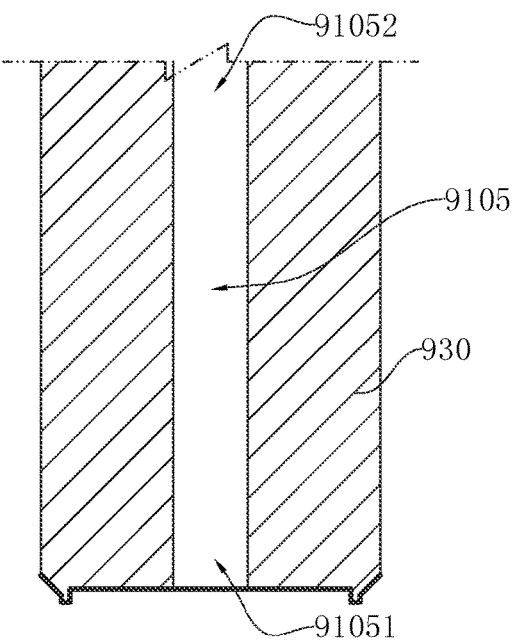
FIG. 43 is a perspective view of the upper mould and lower mould according to the above preferred embodiment of the present invention.

As shown in FIG. 43 of the drawings, the separating element 930 in the preferred embodiment may further has air passage 9105 formed in the separating element 930 and communicating the molding cavity 9103 with the external environment of the molding unit 9100. Through the air passage 9105, a negative pressure can be formed between the bottom surface of the separating element 930 and the buffering membrane 9104, such that the buffering membrane 9104 is forced to firmly attach to the bottom surface of the separating element 930 during the molding process, so as to eliminate the process error such as detachment and offset. More specifically, the air passage 9105 has at least one air inlet 91051 and at least one air outlet 91052 communicated with the at least one air inlet 91051, wherein the air inlet 91051 is formed at the bottom of the separating element 930, so that through the air outlet 91052, the air remaining between the buffering membrane 9104 and the bottom surface of the separating element 930 can be sucked out and then the buffering membrane 9104 will firmly be attracted to the bottom surface of the separating element 930 because of the air pressure difference. It is worth mentioning that the shape of the air inlet 91051 is not intended to be limiting, i.e., the air inlet 91051 may has a circular shape, triangular shape porous shape and the like.

Figure 44:
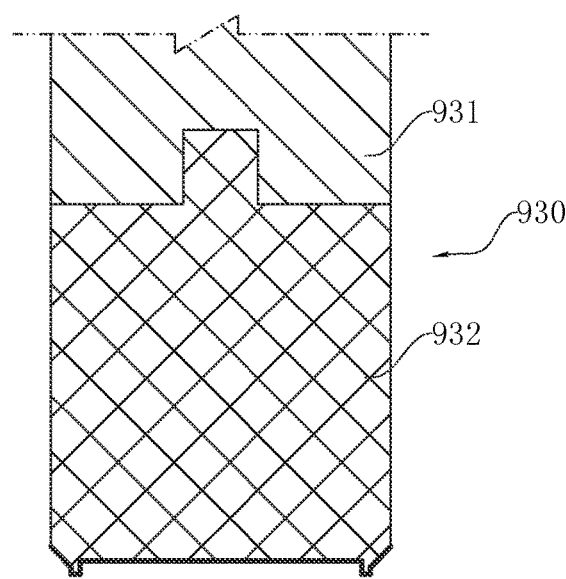
FIG. 44 illustrates an alternative mode of the upper mould according to the above preferred embodiment of the present invention

Referring to FIG. 44 of the drawings, another alternative mode of the separating element 930 is illustrated, wherein the separating element 930 comprises a rigid segment 931 and a flexible segment 932. The flexible segment 932 is coaxially coupled with the rigid segment 931 and downwardly extended from rigid segment 931. When the separating element 930 is overlappedly attached on the photosensitive element 9211, the flexible segment 932 of the separating element 930 is sealedly attached with the photosensitive element 9211. In particular, the flexible segment 932 has a certain degree of flexibility, which can not only effectively prevent the photosensitive element 9211 from being crushed or scratched by the separating element 930, but also enhance the sealing effect of the photosensitive element 9211 and flexible segment 932 of the separating element 930. Preferably, the flexible segment 932 is replaceably coupled with the rigid segment 931 of the separating element 930, such that when the flexible segment 932 fails or loses its normal function, the abnormal flexible segment 932 can be simply replaced with a new flexible segment 932, thereby reducing the cost of the molding unit 9100.

In particular, the flexible segment 932 is made of the flexible material that would not get sticked with the molding material, such that the flexible material can be reused for the molding process so as to further reduce the cost thereof. For instance, the flexible material can be embodied as organic polymer material such as rubber and the rigid segment 931 can be made of metal material, wherein the rubber segment is replaceably coupled to the metal segment to form the separating element 930 of the molding unit 9100. It is worth pointing out that such molding unit 9100 is especially suitable for manufacturing the molded circuit board assembly 920 in which the molded base 923 integrally encapsulates the photosensitive element 9211 and at least a portion of the circuit board 9212. Of Course, such molding unit 9100 may also be suitable for manufacturing the molded circuit board assembly 920 in which the molded base 923 only integrally encapsulates at least a portion of the circuit board 9212.

It is worth mentioning that the separating element 930 can be fully made of flexible material so as to effectively protect the photosensitive element 9211 from being crushed or scratched by the separating element 930 when the separating element 930 is sealedly in contact with the photosensitive element 9211. And it is also worth mentioning that in case the separating element 930 is fully made of the flexible material, the buffering membrane 9104 can also be utilized and the thickness of the buffering membrane 9104 can be reduced.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A manufacturing equipment, for manufacturing a molded circuit board assembly of a camera module, comprising:
   at least one molding unit which comprises at least one upper mould and at least one lower mould, wherein said at least one upper mould and said at least one lower mould in a closed-mould state comprise a molding cavity, said molding cavity configured to place at least one substrate board between said at least one upper mould and said at least one lower mould, wherein said molding cavity comprises at least one supporting frame forming groove for forming a module support frame, and at least one light window forming element for forming a light window of said module support frame, wherein said module support frame is integrally molded on said at least one substrate board to form said molded circuit board assembly;

wherein said at least one upper mould comprises said at least one supporting frame forming groove and said at least one light window forming element, and said at least one lower mould comprises at least one substrate board receiving groove for placing said at least one substrate board; and wherein said at least one upper mould further comprises at least one main flow channel groove while said at least one lower mould further comprises at least one material discharging chute, wherein said at least one main flow channel groove and said at least one material discharging chute form at least one main flow channel, wherein at least one sub flow channel is formed between said at least one upper mould and said at least one lower mould, wherein each of said at least one sub flow channels is communicated with each of said molding cavity, wherein at least one molding material entering the at least one main flow channel is guided to the molding cavity through the at least one sub flow channel, said module support frame is formed within said molding cavity, and at least one solidified molded extension is formed within said at least one main flow channel and said at least one sub flow channel.

2. The manufacturing equipment, as recited in claim 1, wherein said at least one upper mould comprises at least one upper molding surface and said at least one lower mould comprises at least one lower molding surface for said at least one substrate board of said molded circuit board assembly being placed thereon, wherein said molding cavity is formed between said at least one upper molding surface and said at least one lower molding surface, which are in a closed-mould state.

3. The manufacturing equipment, as recited in claim 1, wherein said at least one upper mould is adapted for said at least one substrate board of said molded circuit board assembly being placed thereat and faced downwardly, wherein said at least one lower mould further comprises at least one main flow channel groove while said at least one upper mould further comprises at least one material discharging chute, wherein said at least one main flow channel groove and said at least one material discharging chute form at least one main flow channel, wherein at least one sub flow channel is formed between said at least one upper mould and said at least one lower mould, and each of said at least one sub flow channels is communicated with each of said molding cavity, wherein at least one molding material entering the at least one main flow channel is guided to the molding cavity through the at least one sub flow channel, and said module support frame is formed within said molding cavity, and at least one solidified molded extension is formed within said at least one main flow channel and said at least one sub flow channel.

4. The manufacturing equipment, as recited in claim 1, wherein said at least one molding unit further comprises at least one loading platform, and at least one mould fixing arrangement that is a pressing member, and said pressing member controls opening and closing of said at least one upper mould and said at least one lower mould, wherein said at least one upper mould is fixed to said pressing member and said at least one lower mould is provided on said at least one loading platform.

5. The manufacturing equipment, as recited in claim 4, further comprising at least one material unit, at least one feeding unit and at least one transporting unit, wherein said at least one material unit supplies said at least one molding material forming said module support frame, wherein said at least one feeding unit feeds at least one substrate board array with at least one substrate board, wherein said at least one transporting unit transports said at least one substrate board array to said at least one molding unit, wherein said at least one material unit comprises at least one material transporting member that quantificationally transports said at least one molding material to said at least one molding unit.

6. The manufacturing equipment, as recited in claim 5, wherein said at least one material unit further comprises at least one material supplying member and at least one material controlling member, wherein said at least one material supplying member stores and supplies said at least one molding material, wherein said at least one material controlling member controls an output quantity of said at least one molding material.

7. The manufacturing equipment, as recited in claim 6, wherein said at least one material unit further comprises at least one material discharging element, wherein said at least one material discharging element has at least one plunger piston pushing said at least one molding material into said molding cavity.

8. The manufacturing equipment, as recited in claim 7, wherein said manufacturing equipment further comprises at least one cutting unit, wherein said at least one cutting unit separates each of said at least one solidified molded extension from said module support frame.

9. The manufacturing equipment, as recited in claim 1, wherein said at least one substrate board to be placed at said at least one upper mould and said at least one lower mould comprises a board and a plurality of circuit electronic components protruded on said board, wherein said circuit electronic components are embedded in said module support frame.

* * * * *